(12) United States Patent
Lai et al.

(10) Patent No.: US 11,455,957 B2
(45) Date of Patent: Sep. 27, 2022

(54) SHIFT REGISTER CIRCUIT WITH LATCH POTENTIAL AND ITS DRIVING METHOD, DISPLAY PANEL, AND DISPLAY DEVICE

(71) Applicant: Xiamen Tianma Micro-Electronics Co., Ltd., Xiamen (CN)

(72) Inventors: Qingjun Lai, Xiamen (CN); Yihua Zhu, Xiamen (CN); Shaorong Yu, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 17/350,195

(22) Filed: Jun. 17, 2021

(65) Prior Publication Data

US 2022/0223109 A1 Jul. 14, 2022

(30) Foreign Application Priority Data

Jan. 8, 2021 (CN) .......................... 202110024400.6

(51) Int. Cl.
*G09G 5/00* (2006.01)
*G09G 3/3266* (2016.01)
*G11C 19/28* (2006.01)

(52) U.S. Cl.
CPC .......... *G09G 3/3266* (2013.01); *G11C 19/28* (2013.01); *G09G 2300/0823* (2013.01); *G09G 2310/0286* (2013.01); *G09G 2310/061* (2013.01); *G09G 2310/08* (2013.01); *G09G 2330/021* (2013.01)

(58) Field of Classification Search
CPC ......... G09G 3/3266; G09G 2300/0823; G09G 2310/0286; G09G 2310/061; G09G 2310/08; G09G 2330/021; G11C 19/28
See application file for complete search history.

(56) References Cited

U.S. PATENT DOCUMENTS

| 2014/0098017 | A1* | 4/2014 | Murakami | G09G 3/3677 345/100 |
| 2016/0225462 | A1* | 8/2016 | Harada | G11C 19/28 |
| 2017/0148392 | A1* | 5/2017 | Kim | G09G 3/3677 |
| 2021/0335177 | A1* | 10/2021 | Feng | G09G 3/3266 |

FOREIGN PATENT DOCUMENTS

CN 103632633 B 8/2016

\* cited by examiner

*Primary Examiner* — Adam J Snyder
(74) *Attorney, Agent, or Firm* — Anova Law Group, PLLC

(57) ABSTRACT

A shift register circuit and its driving method, a display panel, and a display device are provided. The shift register circuit includes an input module, a first inverter, a second inverter, and an output module. The input module is connected to a first input terminal, a second input terminal, a third input terminal, and a first electrical-level terminal, to respond to signals from the second and third input terminal and control a voltage of a first node. In the first inverter, an input terminal is connected to the first node, and an output terminal is connected to a second node. In the second inverter, an input terminal is connected to the second node, and an output terminal is connected to the first node. The output module provides a signal of the fourth input terminal to an output terminal of the output module, and also provides a voltage of a first power terminal to the output terminal of the output module.

19 Claims, 30 Drawing Sheets

SHIFT REGISTER CIRCUIT WITH LATCH POTENTIAL AND ITS DRIVING METHOD, DISPLAY PANEL, AND DISPLAY DEVICE

CROSS-REFERENCE TO RELATED APPLICATION

This application claims the priority of Chinese Patent Application No. 202110024400.6, filed on Jan. 8, 2021, the content of which is incorporated herein by reference in its entirety.

TECHNICAL FIELD

The present disclosure generally relates to the field of display technologies and, more particularly, relates a shift register circuit and its driving method, a display panel, and a display device.

BACKGROUND

In exiting technologies, display devices include liquid crystal display devices and self-luminous display devices. The self-luminous display devices include inorganic light-emitting diode display devices and organic light-emitting diode (OLED) display devices. Active-matrix organic light-emitting diode (AMOLED) have been widely used in the display field because of their advantages of high brightness, full viewing angle, fast response speed, or flexible display.

A frame area of an existing display device includes a peripheral driving circuit for providing driving signals for pixel units in a display area. Taking an OLED display device as an example, in an existing OLED display device, a plurality of pixel units are provided in the display area, and each pixel unit of the plurality of pixel units includes an OLED and a pixel circuit connected to the OLED. Each pixel circuit is electrically connected to the peripheral driving circuit in the frame area, and the peripheral driving circuit provides a scanning control signal and a light emission control signal to the pixel circuit to control the pixel circuit to provide a driving current to the OLED. However, the working stability of the existing peripheral driving circuit is poor, which reduces the display effect of the display device.

SUMMARY

One aspect of the present disclosure provides a shift register circuit. The shift register circuit includes an input module, a first inverter, a second inverter, and an output module. The input module is electrically connected to a first input terminal, a second input terminal, a third input terminal, and a first electrical-level terminal, and is configured to respond to signals from the second input terminal and the third input terminal to control a voltage of a first node. An input terminal of the first inverter is electrically connected to the first node, and an output terminal of the first inverter is electrically connected to a second node. An input terminal of the second inverter is electrically connected to the second node, and an output terminal of the second inverter is electrically connected to the first node. The output module is configured to respond to a potential of the first node to provide a signal of the fourth input terminal to an output terminal of the output module, and is also configured to respond to a potential of the second node to provide a voltage of a first power terminal to the output terminal of the output module.

Another aspect of the present disclosure provides a driving method for a shift register circuit. The shift register circuit includes an input module, a first inverter, a second inverter, and an output module. The input module is electrically connected to a first input terminal, a second input terminal, a third input terminal, and a first electrical-level terminal, and is configured to respond to signals from the second input terminal and the third input terminal to control a voltage of a first node. An input terminal of the first inverter is electrically connected to the first node, and an output terminal of the first inverter is electrically connected to a second node. An input terminal of the second inverter is electrically connected to the second node, and an output terminal of the second inverter is electrically connected to the first node. The output module is configured to respond to a potential of the first node to provide a signal of the fourth input terminal to an output terminal of the output module, and is also configured to respond to a potential of the second node to provide a voltage of a first power terminal to the output terminal of the output module. The driving method includes a first stage, a second stage, and a third stage performed sequentially. In the first stage, the input module controls the first input terminal to be connected to the first node in response to the signal of the second input terminal, and the output module controls the fourth input terminal to be connected to the output terminal of the output module in response to the signal of the first node. In the second stage, the output module maintains controlling the fourth input terminal to be connected to the output terminal of the output module in response to the signal of the first node. In the third stage, the input module controls the first electrical-level terminal to be connected to the first node in response to the signal of the third input terminal, and the output module controls the first power terminal to be connected to the output terminal of the output module in response to the signal of the second node.

Another aspect of the present disclosure provides a display panel. The display panel includes a scanning driving circuit. The scanning driving circuit includes multi-level shift register circuits. Each level shift register circuit includes an input module, a first inverter, a second inverter, and an output module. The input module is electrically connected to a first input terminal, a second input terminal, a third input terminal, and a first electrical-level terminal, and is configured to respond to signals from the second input terminal and the third input terminal to control a voltage of a first node. An input terminal of the first inverter is electrically connected to the first node, and an output terminal of the first inverter is electrically connected to a second node. An input terminal of the second inverter is electrically connected to the second node, and an output terminal of the second inverter is electrically connected to the first node. The output module is configured to respond to a potential of the first node to provide a signal of the fourth input terminal to an output terminal of the output module, and is also configured to respond to a potential of the second node to provide a voltage of a first power terminal to the output terminal of the output module.

Another aspect of the present disclosure provides a display device. The display device includes a display panel. The display panel includes a scanning driving circuit. The scanning driving circuit includes multi-level shift register circuits. Each level shift register circuit includes an input module, a first inverter, a second inverter, and an output module. The input module is electrically connected to a first input terminal, a second input terminal, a third input terminal, and a first electrical-level terminal, and is configured to respond to signals from the second input terminal and the third input terminal to control a voltage of a first node. An input terminal of the first inverter is electrically connected to the first node, and an output terminal of the first inverter is electrically connected to a second node. An input terminal of the second inverter is electrically connected to the second node, and an output terminal of the second inverter is electrically connected to the first node. The output module is configured to respond to a potential of the first node to provide a signal of the fourth input terminal to an output terminal of the output module, and is also configured to respond to a potential of the second node to provide a voltage of a first power terminal to the output terminal of the output module Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
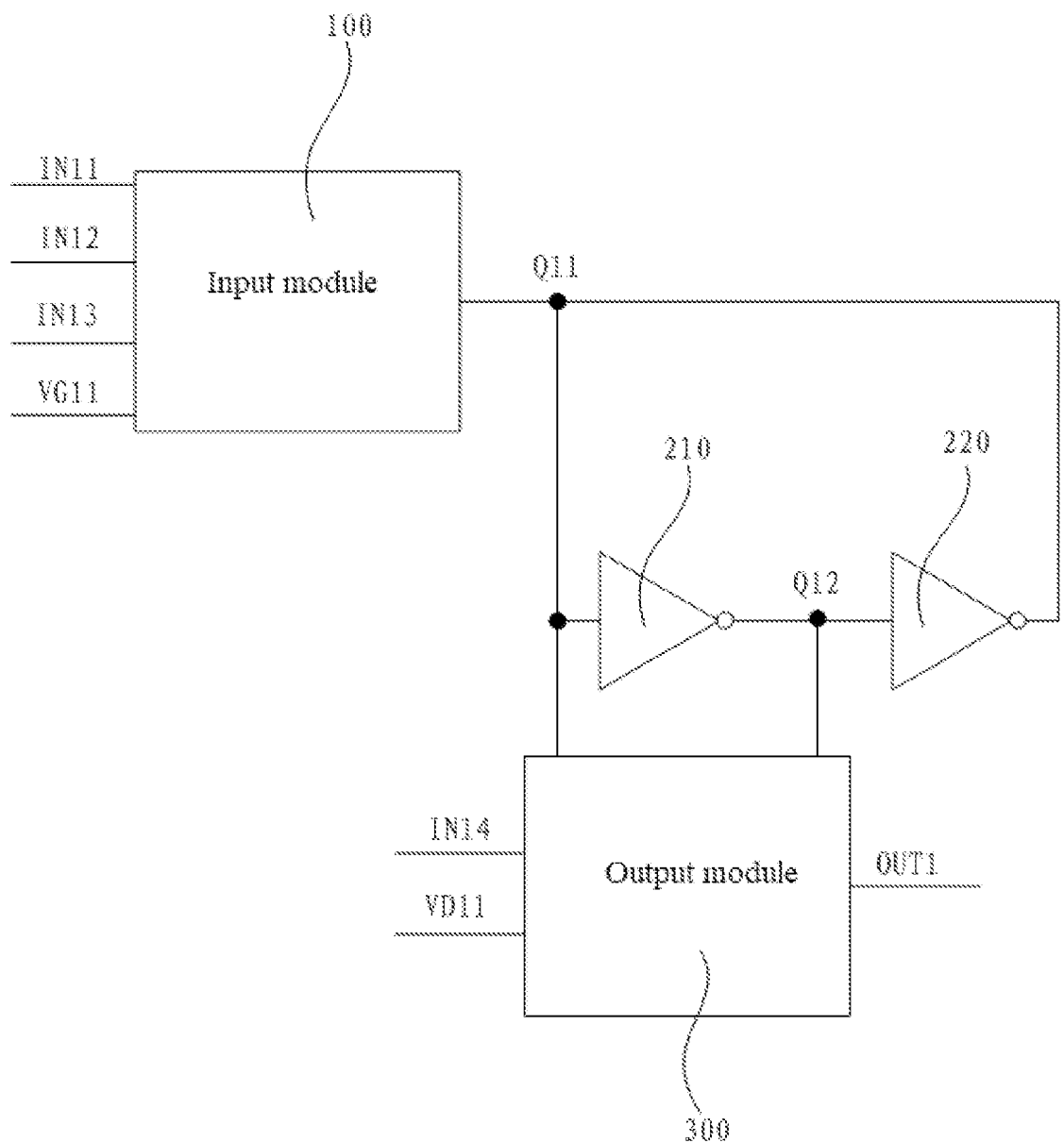
FIG. 1 illustrates an exemplary shift register circuit consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

The present disclosure provides a shift register circuit and its driving method, a display panel, and a display device. The shift register circuit may have a high operating stability and the display effect of the display device may be improved.

One embodiment of the present disclosure provides a shift register circuit. As illustrated in FIG. 1, the shift register circuit may include an input module 100, a first inverter 210, a second inverter 220, and an output module 300.

The input module 100 may be electrically connected to a first input terminal IN11, a second input terminal IN12, a third input terminal IN13, and a first electrical-level terminal VG11, for responding to signals of the second input terminal IN12 and the third input terminal IN13, and controlling the potential of a first node Q11.

An input terminal of the first inverter 210 may be electrically connected to the first node Q11, and an output terminal of the first inverter 210 may be electrically connected to a second node Q12. An input terminal of the second inverter 220 may be electrically connected to the second node Q12, and an output terminal of the second inverter 220 may be electrically connected to the first node Q11.

The output module 300 may be configured to respond to the potential of the first node Q11, and transmit the signal of the fourth input terminal IN14 to an output terminal OUT1 of the output module 300. The output module 300 may be also configured to respond to the potential of the second node Q12 and provide the voltage of a first power terminal VD11 to the output terminal OUT1 of the output module 311.

In the present disclosure, the shift register circuit may realize the latching of the potential at the first node and the second node through the first inverter and the second inverter, ensuring that the potential stability at the first node and the second node under low frequency and high frequency conditions are high. Correspondingly, the shift register circuit may have a high operating stability and the display effect of the display device may be improved.

Figure 2:
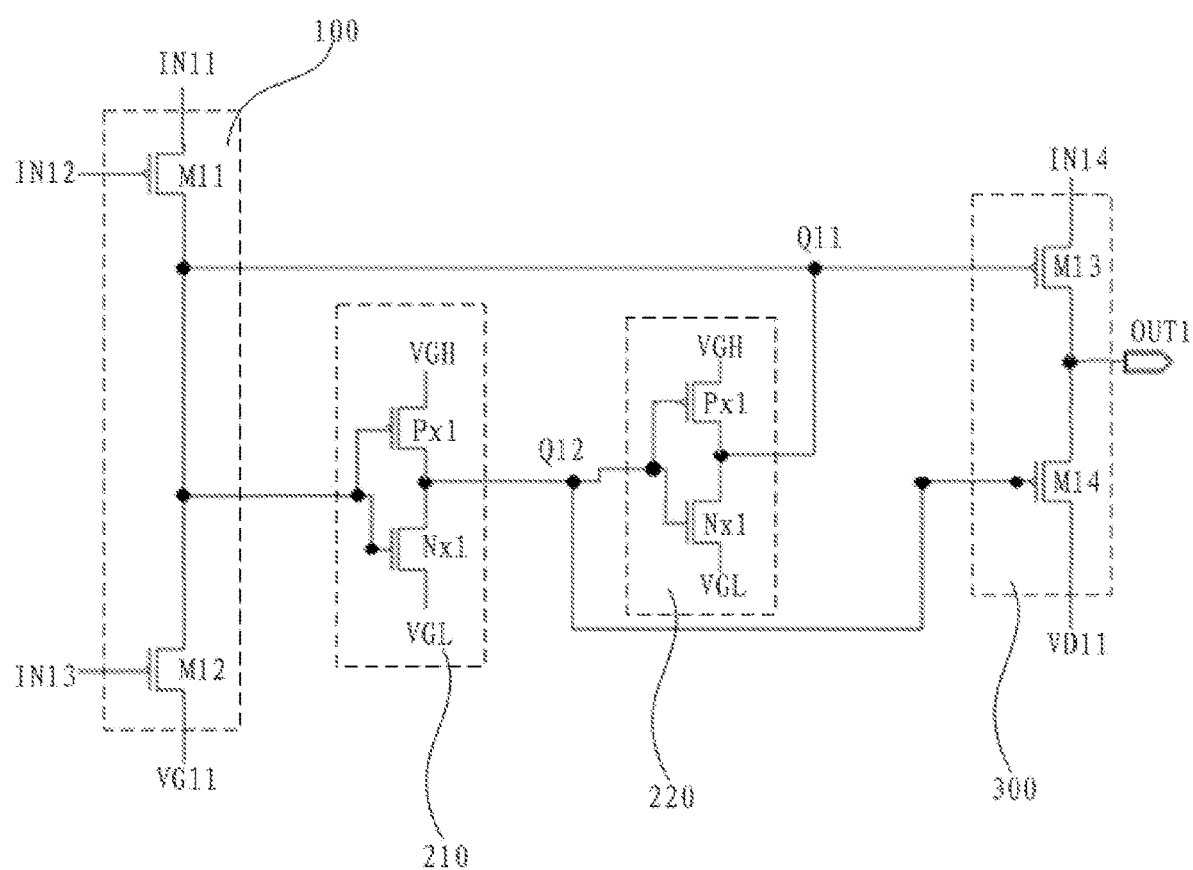
FIG. 2 illustrates another exemplary shift register circuit consistent with various disclosed embodiments in the present disclosure.

FIG. 2 illustrated an exemplary shift register circuit provided by another embodiment of the present disclosure. As shown in FIG. 2, at least one inverter of the first inverter 210 and the second inverter 211 may include a P-type transistor Px1 and an N-type transistor Nx1. A gate of the P-type transistor Px1 and a gate of the N-type transistor Nx1 may be electrically connected as the input terminal of the inverter. A second terminal of the P-type transistor Px1 and a second terminal of the N-type transistor Nx1 may be electrically connected as the output terminal of the inverter. A first terminal of the P-type transistor Px1 may be collected to a high level signal VGH and a first terminal of the N-type transistor Nx1 may be connected to a low level signal VGL.

Figure 3:
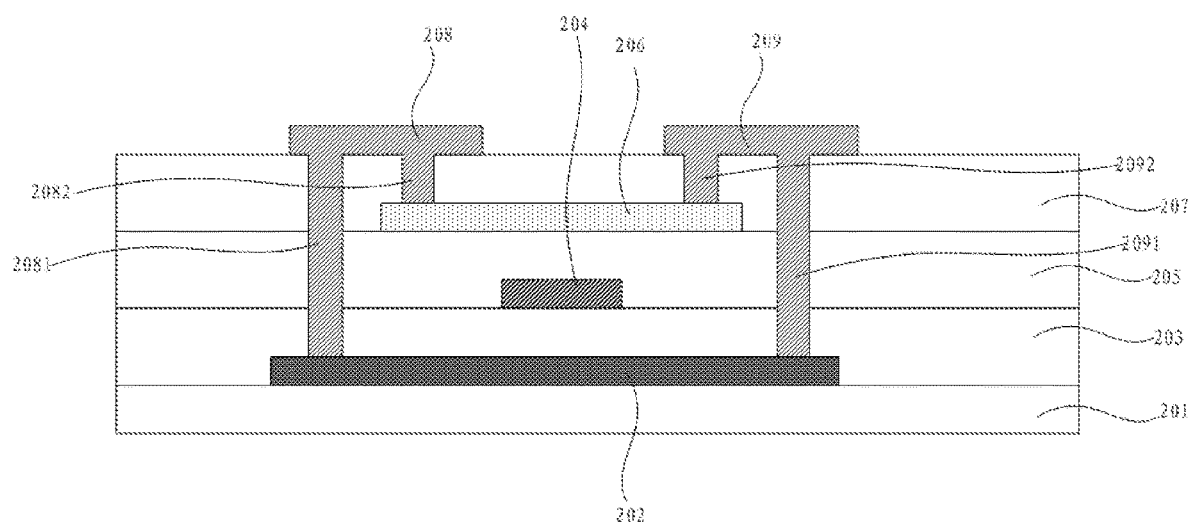
FIG. 3 illustrates an exemplary inverter consistent with various disclosed embodiments in the present disclosure.

FIG. 3 illustrates an exemplary inverter provided by various embodiments of the present disclosure. The inverter in FIG. 3 may be used as one of the first inverter or the second inverter. The inverter may include a base substrate 201, a P-type active layer 202 on the base substrate 201, a first insulating layer 203 on a side of the P-type active layer 202 away from the base substrate 201, a gate 204 on a side of the first insulating layer 203 away from the base substrate 201, a second insulating layer 205 on a side of the gate 204 away from the base substrate 201, an N-type active layer 206 on a side of the second insulating layer 205 away from the base substrate 201, a third insulating layer 207 on a side of the N-type active layer 206 away from the base substrate 201, and a source 208 and a drain 209 on a side of the third insulating layer 207 away from the base substrate 201. The source 208 may be connected to the P-type active layer 202 through a first through hole 2091, and may be connected to the N-type active layer 206 through a second through hole 2092. The drain 209 may be connected to the P-type active layer 202 through a third through hole 2093, and may be connected to the N-type active layer 206 through a fourth through hole 2094. The P-type active layer 202, the gate 204, the source 208, the drain 209 and the corresponding insulating layers may form the P-type transistor of the inverter. The N-type active layer 202, the gate 204, the source 208, the drain 209 and the corresponding insulating layers may form the N-type transistor of the inverter.

In the present disclosure, the N-type transistor and the P-type transistor of the inverter may share the gate, the source, the drain, and the corresponding insulating layers. Correspondingly, a size of the inverter may be reduced and wiring spaces of the shift register circuit may be saved.

In one embodiment, the N-type active layer 206 may be made of a material including (In,Ga,Zn)O2, and the P-type active layer 202 may be made of a material including polycrystalline silicon. The present disclosure has no limit on this.

For description purposes only, the inverter in FIG. 3 is used as an example to illustrate the present disclosure, and does not limit the scope of the present disclosure. For example, in some other embodiments, the inverter may include other structures which can be configured according to actual needs. For example, in one embodiment, the N-type transistor and the P-type transistor of the inverter may be independent transistors, and may not overlap along a stacking direction of film layers. Gates, sources, and drains of the N-type transistor and the P-type transistor of the inverter may be connected correspondingly to form the inverter.

In one embodiment, a voltage range of the high level signal VGH may be $6V \leq VGH \leq 14V$. For example, the value of VGH may be 8V, or the value of VGH may be 10V. A voltage range of the low level signal VGL can be $-14V \leq VGL \leq -6V$. For example, the value of VGL can be −10V, or the value of VGL can be −7V.

In the present disclosure, the input terminal of the first inverter may be connected to the first node, and the output terminal of the first inverter may be connected to the second node. When the level of the first node is low, the first node may control the P-type transistor of the first inverter to turn on and control the N-type transistor of the first inverter to turn off, to transmit the high level signal to the second node. When the level of the first node is high, the first node may control the N-type transistor of the first inverter to turn on and control the P-type transistor of the first inverter to turn off, to transmit the low level signal to the second node. Therefore, the conduction states of the P-type transistor and the N-type transistor of the inverter may be controlled by the first node, to transmit a stable high level signal or a low level signal to the second node to ensure high stability of the potential at the second node.

Similarly, the input terminal of the second inverter may be connected to the second node, and the output terminal of the second inverter may be connected to the first node. The conduction states of the P-type transistor and the N-type transistor of the second inverter may be controlled through the second node, to transmit a stable high level signal or a low level signal to the first node to ensure high stability of the potential of the first node.

Further, in the present disclosure, the first inverter and the second inverter may be connected to each other in an end-to-end manner and may be electrically connected to the first node and the second node. Correspondingly, the potential stability of the first node and the second node may be ensured to be high. Also, since the first inverter and the second inverter have strong anti-leakage capabilities, it can further ensure that the potential stability of the first node and the second node is high, and improve the stability of the shift register circuit. At the same time, only the first inverter and the second inverter may be used to achieve the potential latching of the first node and the second node. The shift register circuit provided by the embodiments of the present disclosure is simpler than a more complicated circuit.

In one embodiment, the N-type transistor may be a metal oxide transistor. For example, the N-type transistor may be an IGZO (Indium Gallium Zinc Oxide) transistor. By preparing the N-type transistor in the inverter as an IGZO transistor, the leakage current of the N-type transistor can be reduced and the stability of maintaining the potential of the first node and the second node may be improve3d. Correspondingly, the stability of the shift register circuit at the low-frequency working state or the high-frequency working state may be guaranteed. Furthermore, on the basis of ensuring the high stability of the shift register circuit, the shift register circuit can provide a more stable signal to pixel units connected to it, thereby ensuring high light-emitting stability of the pixel units. The display of the display device may be improved. Also, the fabrication process of the IGZO transistor may be simple and the IGZO transistor may be small in size, which can reduce the size of the inverter, reduce the space occupied by the inverter, and finally achieve the purpose of saving the wiring space of the shift register circuit.

As illustrated in FIG. 2, the input module 100 may include a first transistor M11 and a second transistor M12. A first terminal of the first transistor M11 may be electrically connected to the first input terminal IN11. A gate of the first transistor M11 may be electrically connected to the second input terminal IN12, and a second terminal of the first transistor M11 may be electrically connected to the first node Q11. The first terminal of the second transistor M12 may be electrically connected to the first electrical-level terminal VG11, a second terminal of the second transistor M12 may be electrically connected to the first node Q11, and a gate of the second transistor M12 may be electrically connected to the third input terminal IN13.

Figure 4:
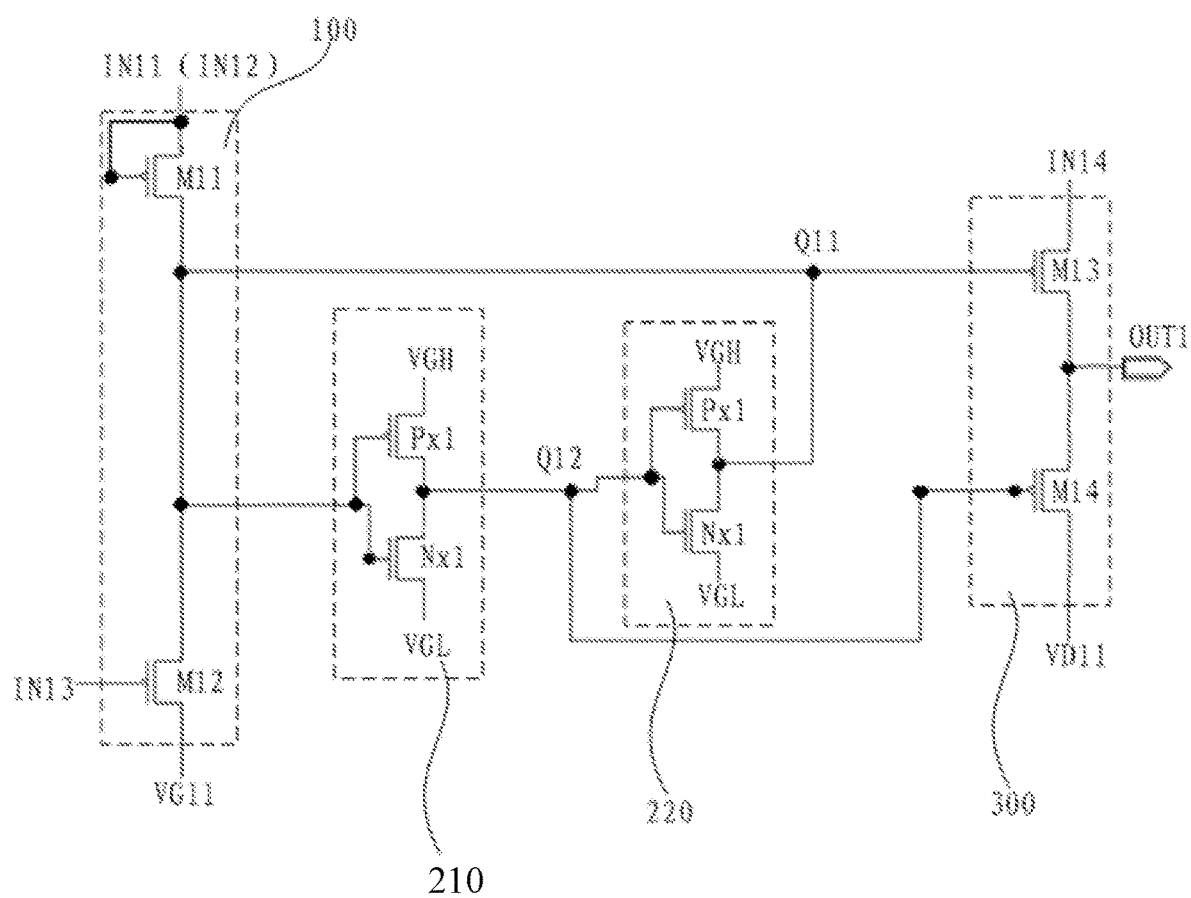
FIG. 4 illustrates another exemplary shift register circuit consistent with various disclosed embodiments in the present disclosure.

In one embodiment, signals of the first input terminal IN11 and the second input terminal IN12 may both be turn-on signals; and a signal of the third input terminal IN13 may be a first clock signal. A signal of the fourth input terminal IN14 may be a second clock signal. As illustrated in FIG. 4 showing another shift register circuit, the signals output by the first input terminal IN11 and the second input terminal IN12 may be same and may be the turn-on signals. Correspondingly, the first input terminal IN11 and the second input terminal IN12 can be connected to a same terminal. Correspondingly, the first input terminal IN11 and the second input terminal IN12 may be connected to a same turn-on signal input terminal, and the turn-on signal at the turn-on signal input terminal may be used to control the first transistor M11 to be turned on or off. Further, the turn-on signal at the turn-on signal input terminal can be transmitted to the first node Q11 through the first transistor M11. Correspondingly, the number of terminals of the shift register circuit may be reduced, and the wiring space of the shift register circuit may be saved. For description purposes only, the embodiment in FIG. 4 where the first input terminal IN11 and the second input terminal IN12 may be connected to a same turn-on signal input terminal is used as an example to illustrate the present disclosure, and does not limit the scope of the present disclosure. In some other embodiments, the first input terminal and the second input terminal may also be configured as two independent terminals that need to be specifically designed according to actual applications. Signals of the third input terminal IN13 and the fourth input terminal IN14 may both be clock signals, such that the third input terminal IN13 and the fourth input terminal IN14 can be provided with corresponding clock signals through different clock signal lines.

Figure 8:
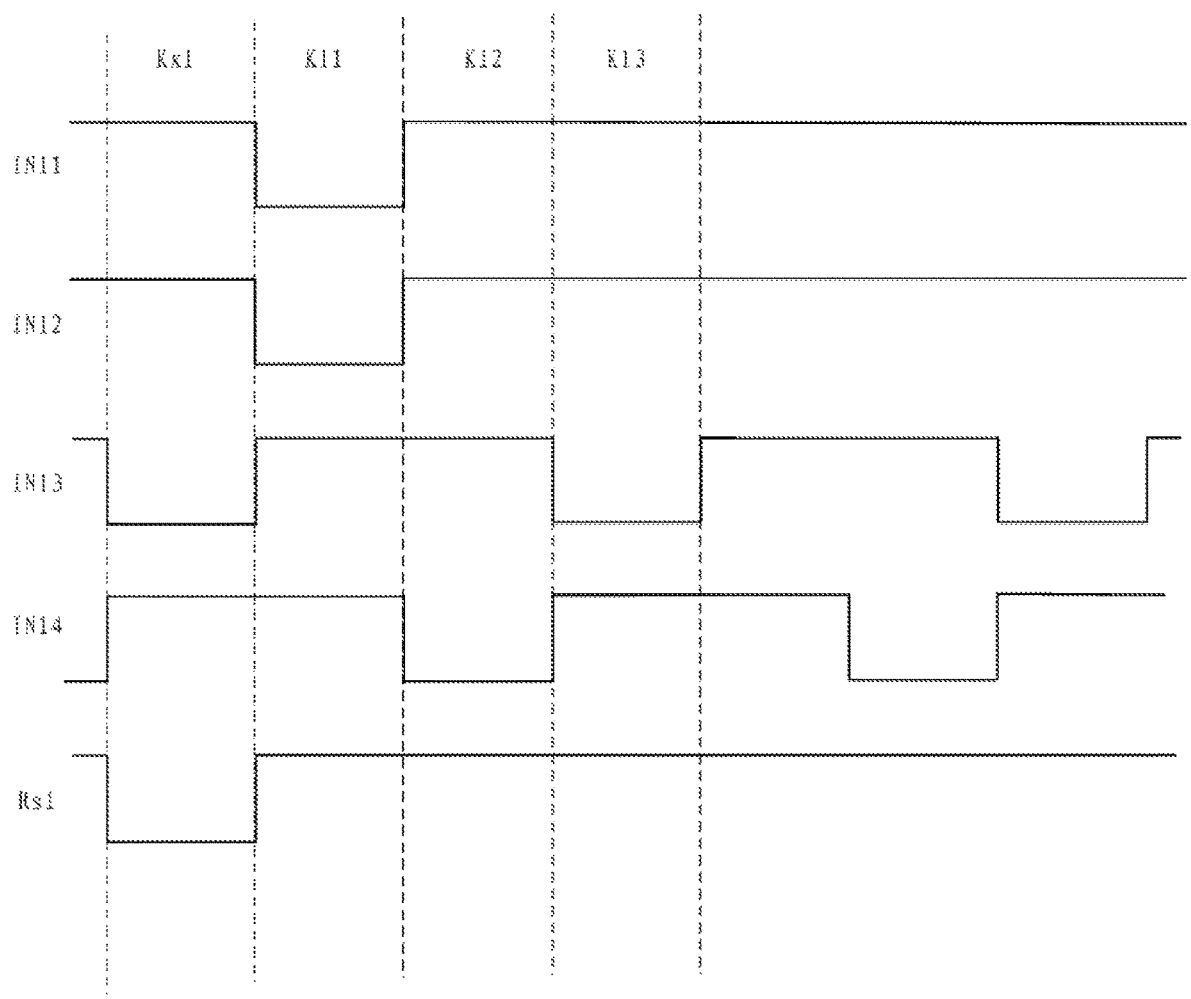
FIG. 8 illustrates an exemplary timing diagram of a shift register circuit consistent with various disclosed embodiments in the present disclosure.

Within one clock cycle of the first clock signal, a duration ratio between an enable signal segment and a non-enable signal segment may be approximately 1/2. Within one clock cycle of the second clock signal, a duration ratio between an enable signal segment and a non-enable signal segment may be about 1/2. Specifically, within one clock cycle of the first clock signal, the duration ratio between the enable signal segment and the non-enable signal segment may be at most 1/2, and within one clock cycle of the second clock signal, the duration ratio between the enable signal segment and the non-enable signal segment may be at most 1/2. Specific duration design can be carried out according to actual applications and the present disclosure has no limit on this. For description purposes only, the first clock signal and the P-type second transistor M12 in FIG. 8 will be used as an example to illustrate the present disclosure for the understanding of the clock cycle, the enable signal segment, and the non-enable signal segment. As shown in FIG. 8, in one clock cycle of the first clock signal (that is, between the start node of the first stage K11 to the terminal node of the third stage K13 in FIG. 8) of the third input terminal IN13, the duration ratio between the enable signal segment (that is, the period of the low level that controls the P-type second transistor M12 to turn on) and the non-enable signal segment (that is, the period of high level that controls the P-type second transistor M12 to turn off) may be at most 1/2.

A driving capability of the first transistor may be larger than a driving capability of one of the transistors in the second inverter connected to an electrical-level signal opposite to the enable signal output by the first input terminal. The second inverter may include the P-type transistor and the N-type transistor. The first terminal of the P-type transistor may be connected to a high level signal, and the first terminal of the N-type transistor may be connected to a low level signal. When the enable signal of the first input terminal is low level, the driving capability of the first transistor may be larger than the driving capability of the P-type transistor in the second inverter. When the enable signal at the first input terminal is a high level, the driving capability of the first transistor may be larger than the driving capability of the N-type transistor in the second inverter. Correspondingly, it is ensured that the enable signal transmitted by the first transistor can effectively replace the potential of the first node at the previous moment. Specifically, when the enable signal of the first input terminal is low level, and before the enable signal of the first input terminal is transmitted to the first node, the potential of the first node is a high level, since the output terminals of the first inverter and the second inverter are connected, the high level of the first node may be maintained by the second inverter, that is, the high level of the first node may be maintained by one of the transistors in the second inverter connected to the high level. After the low level of the first input terminal is transmitted to the first node, since the potential of the first node at the previous moment is the high level maintained by one of the transistors in the second inverter connected to the high level, the driving capability of the first transistor may be set to be larger than the driving capacity of one of the transistors in the second inverter connected to the high level, to ensure that the high level of the first node at the previous moment can be successfully transformed into the low level of the first input terminal transmitted by the first transistor presently.

Further, in one embodiment, width-length ratios of the transistors may be configured to optimize driving capability of different transistors. The width-length ratio of the first transistor may be larger than the width-length ratio of one of the transistors in the second inverter connected to an electrical-level signal opposite to the enable signal output by the first input terminal. Specifically, as illustrated in FIG. 2, in one embodiment, the first transistor M11 may be a P-type transistor, and the enable signal of the first input terminal IN11 may be a low level signal. The width-length ratio of the first transistor M11 may be larger than the width-length ratio the P-type transistor Px1 in the second inverter connected to the high level signal VGH. For description purposes only, the present embodiment is used as an example to illustrate the present disclosure, and does not limit the scope of the present disclosure. In various embodiments, any suitable methods may be used to optimize driving capability of different transistors. For example, in some other embodiments, types of different transistors may be configured to make the driving capability of the first transistor larger than the driving capability of one of the transistors in the second inverter connected to an electrical-level signal opposite to the enable signal output by the first input terminal. Specifically, the first transistor may be a polycrystalline silicon transistor, and when the one transistor of the transistors in the second inverter connected to an electrical-level signal opposite to the enable signal output by the first input terminal is an N-type transistor, the N-type transistor may be an IGZO transistor.

A width-length ratio of a transistor may be a ratio between width and length of a channel of the transistor. The width-length ratio of the transistor may be proportional to the driving capability of the transistor. That is, when the width-length ratio of the transistor is larger, the driving capability of the transistor may be larger.

A driving capability of the second transistor may be larger than a driving capability of one of the transistors in the second inverter connected to an electrical-level signal opposite to the electrical-level signal output by the first electrical-level terminal. The second inverter may include the P-type transistor and the N-type transistor. The first terminal of the P-type transistor may be connected to a high level signal, and the first terminal of the N-type transistor may be connected to a low level signal. When the signal of the first electrical-level terminal is low level, the driving capability of the second transistor may be larger than the driving capability of the P-type transistor in the second inverter. When the signal of the first electrical-level terminal is high level, the driving capability of the second transistor may be larger than the driving capability of the N-type transistor in the second inverter. Correspondingly, it is ensured that the electrical-level signal transmitted by the second transistor can effectively replace the potential of the first node at the previous moment. Specifically, when the electrical-level signal of the first electrical-level terminal is low level, and before the high level signal of the first electrical-level terminal is transmitted to the first node, the potential of the first node is high level, since the output terminal of the second inverter may be connected to the second node, the low level of the first node may be maintained by the second inverter, that is, the low level of the first node may be maintained by one of the transistors in the second inverter connected to the low level. After the high level of the first electrical-level terminal is transmitted to the first node, since the potential of the first node at the previous moment is the low level maintained by one of the transistors in the second inverter connected to the low level, the driving capability of the second transistor may be set to be greater than the driving capacity of one of the transistors in the second inverter connected to the low level, to ensure that the low level of the first node at the previous moment can be successfully transformed into the high level of the first electrical-level terminal transmitted by the second transistor presently.

Further, in one embodiment, width-length ratios of the transistors may be configured to optimize driving capability of different transistors. The width-length ratio of the second transistor may be larger than the width-length ratio of one of the transistors in the second inverter connected to an electrical-level signal opposite to the electrical-level signal output by the first electrical-level terminal. Specifically, as illustrated in FIG. 2, in one embodiment, the second transistor M12 may be a P-type transistor, and the electrical-level signal of the first electrical-level terminal VG11 may be a high level signal. The width-length ratio of the second transistor M12 may be larger than the width-length ratio the N-type transistor Nx1 in the second inverter connected to the low level signal VGL. For description purposes only, the present embodiment is used as an example to illustrate the present disclosure, and does not limit the scope of the present disclosure. In various embodiments, any suitable methods may be used to optimize driving capability of different transistors. For example, in some other embodiments, types of different transistors may be configured to make the driving capability of the second transistor larger than the driving capability of one of the transistors in the second inverter connected to an electrical-level signal opposite to the electrical-level signal output by the first electrical-level terminal. Specifically, the second transistor may be a polycrystalline silicon transistor, and when the one of the transistors in the second inverter connected to an electrical-level signal opposite to the electrical-level signal output by the first electrical-level terminal is an N-type transistor, the N-type transistor may be an IGZO transistor.

In one embodiment, when the voltage of the first electrical-level terminal VG11 is high level, the first electrical-level terminal VG11 and a power supply terminal of the high level signal VGH may be one same terminal.

As illustrated in FIG. 2, the output module 300 may include a third transistor M13 and a fourth transistor M14. A first terminal of the third transistor M13 may be electrically connected to the fourth input terminal IN14, a second terminal of the third transistor M13 may be electrically connected to the output terminal OUT1 of the output module 300, and a gate of the third transistor M13 may be electrically connected to the first node Q11. A first terminal of the fourth transistor M14 may be electrically connected to the first power supply terminal VD11, a second terminal of the fourth transistor M14 may be electrically connected to the output terminal OUT1 of the output module 300, and a gate of the fourth transistor M14 may be electrically connected to the second node Q12.

Figure 5:
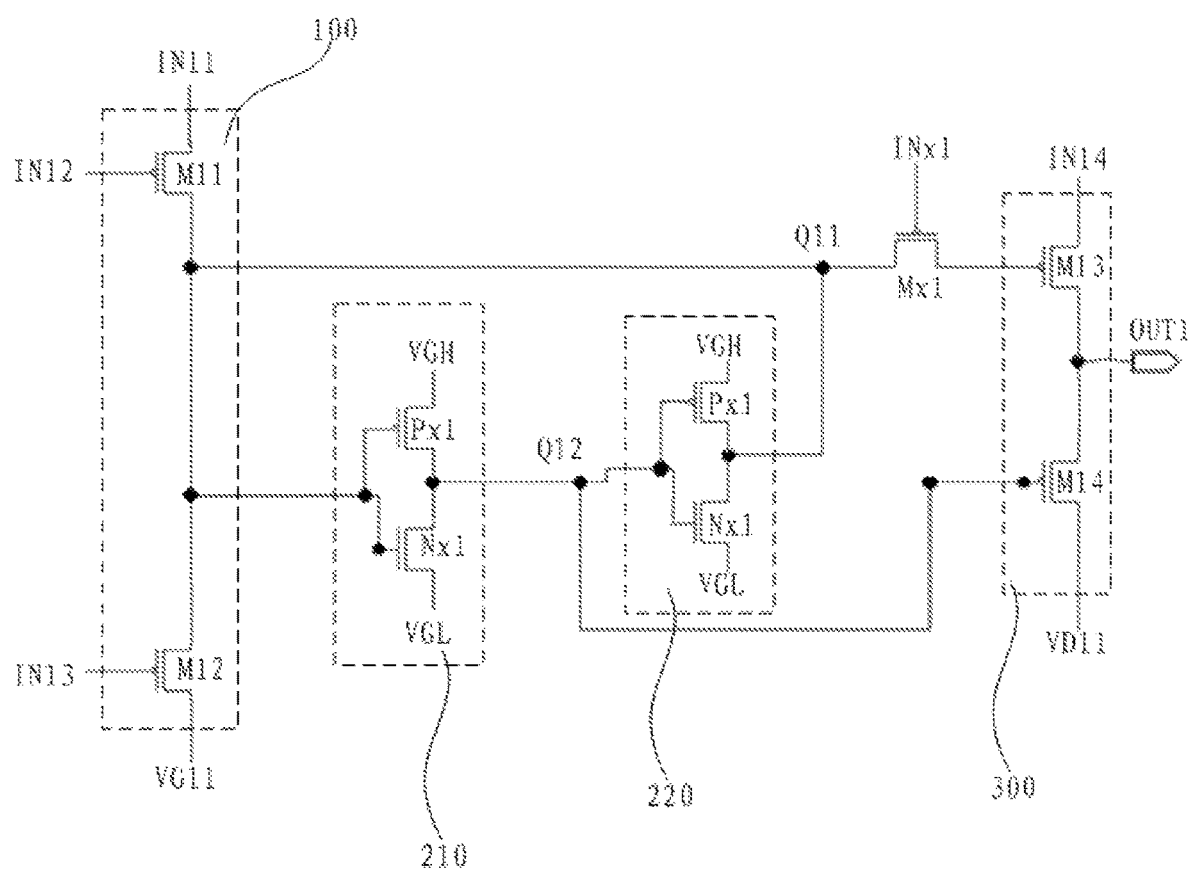
FIG. 5 illustrates another exemplary shift register circuit consistent with various disclosed embodiments in the present disclosure.

Another embodiment of the present disclosure illustrated in FIG. 5 provides another shift register circuit. As illustrated in FIG. 5, the shift register circuit may further include: a conduction transistor Mx1 electrically connected between the first node Q11 and the output module 300. A first terminal of the conduction transistor Mx1 may be electrically connected to the first node Q11, a second terminal of the conduction transistor Mx1 may be electrically connected to the output module 300, and a gate of the conduction transistor Mx1 may be electrically connected to an on-hold signal terminal INx1. The conduction transistor Mx1 may be configured to respond to a signal of the on-hold signal terminal Inx1, to control the conduction transistor Mx1 to maintain a turn-on state. For example, the conduction transistor Mx1 may be a P-type transistor. Correspondingly, the signal of the on-holding signal terminal INx1 may be low level, such as a low level signal VGL, such that the conduction transistor Mx1 may maintain a normally-on state. Alternatively, in another embodiment, the conduction transistor Mx1 may be an N-type transistor. Correspondingly, the signal of the on-hold signal terminal INx1 may be high level, such as a high level signal VGH, such that the conduction transistor Mx1 may maintain a normally-on state. The on-hold signal terminal INx1 provided in the embodiment of the present disclosure may be configured to maintain the turn-on state of the conduction transistor Mx1, such that the conduction state between the first node Q11 and the output module 300 is maintained.

As illustrated in FIG. 5, when the output module 300 includes the circuit structure in FIG. 5, the first terminal of the conduction transistor Mx1 may be electrically connected to the first node Q11, the second terminal of the conduction transistor Mx1 may be electrically connected to the gate of the third transistor M13. Correspondingly, the connection between the first node Q11 and the gate of the third transistor M13 may be maintained by the conduction transistor Mx1. In the present disclosure, by providing the conduction transistor Mx1, when the gate of the third transistor M13 changes from the high level to a higher voltage, or changes from the low level to a lower voltage, the changing voltage transmitted to the first node Q11 may be improved, to reduce the influence of the voltage change of the gate of the third transistor M13 on the potential of the first node Q11. The voltage stability of the first node Q11 and the stability of the shift register circuit may be improved. In the shift register circuit shown in FIG. 7, a storage capacitor Cx may be connected between the gate of the third transistor M13 and the output terminal of the output module 300. When the storage capacitor Cx is bootstrapped, when the gate of the third transistor M13 changes from the high level to a higher voltage, or changes from the low level to a lower voltage. At this time, the conduction transistor Mx1 may improve the changing voltage transmitted to the first node Q11, to reduce the influence of the voltage change of the gate of the third transistor M13 on the potential of the first node Q11.

Figure 6:
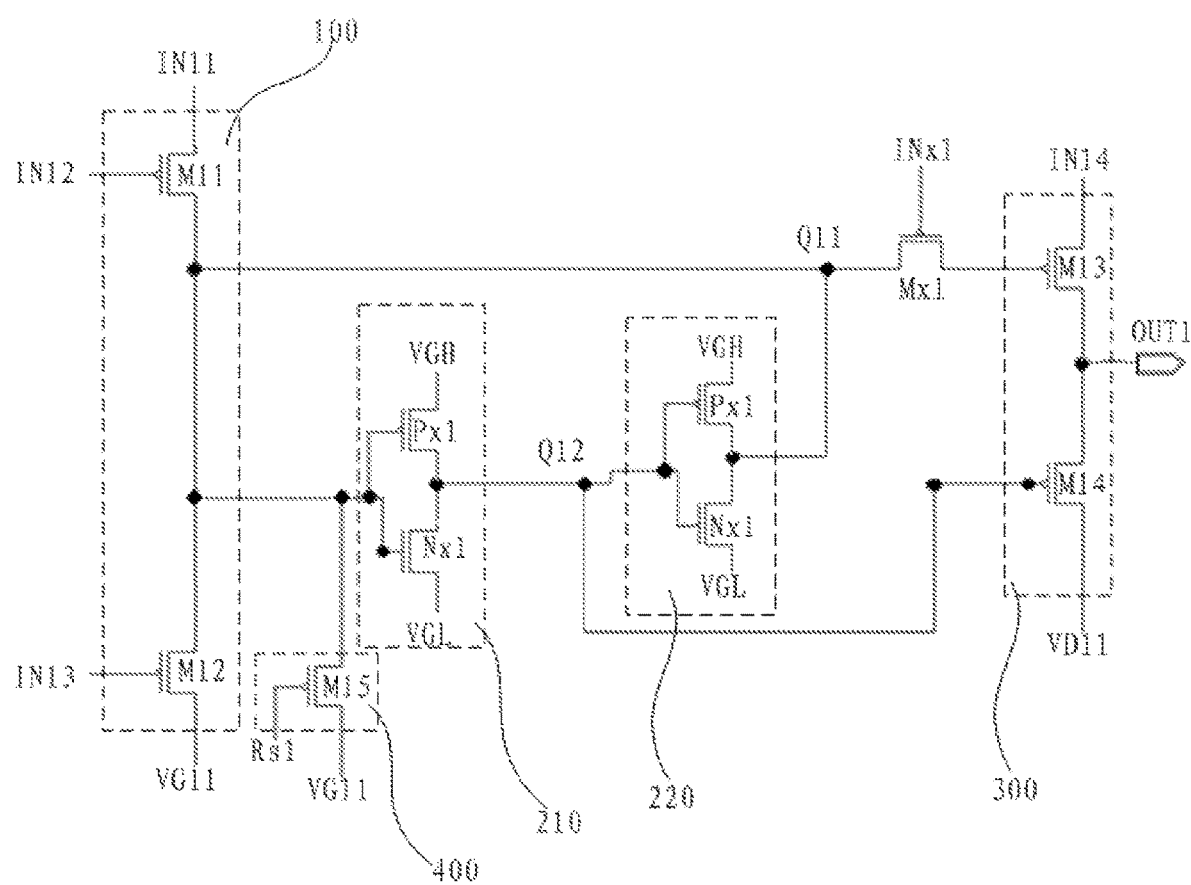
FIG. 6 illustrates another exemplary shift register circuit consistent with various disclosed embodiments in the present disclosure.

Another embodiment of the present disclosure illustrated in FIG. 6 provides another shift register circuit. As illustrated in FIG. 6, the shift register circuit may further include a reset module 400. The reset module 400 may be electrically connected to the first node Q11, a reset control signal terminal Rs1, and the first electrical-level terminal VG11. The reset module 400 may be configured to respond to a signal of the reset control signal terminal Rs1, to transmit the voltage of the first electrical-level terminal VG11 to the first node Q11. By using the reset module 400 to perform signal reset to the shift register circuit, accuracy of the signal during the operation of the shift register circuit may be guaranteed to be high.

As illustrated in FIG. 6, the reset module 400 may include a fifth transistor M15. In the fifth transistor M15, a first terminal may be electrically connected to the first electrical-level terminal VG11, a second terminal may be electrically connected to the first node Q11, and a gate may be electrically connected to the reset control signal terminal Rs1. The driving capability of the fifth transistor may be larger than the driving capability of one of the transistors in the second inverter connected to an electrical-level signal opposite to the electrical-level signal output by the first electrical-level terminal. When the signal of the first electrical-level terminal is low level, the driving capability of the fifth transistor may be larger than the driving capability of the P-type transistor in the second inverter. When the signal of the first electrical-level terminal is high level, the driving capability of the fifth transistor may be larger than the driving capability of the N-type transistor in the second inverter. Correspondingly, it may be ensured that the electrical-level signal of the first electrical-level terminal transmitted by the fifth transistor can effectively replace the potential of the first node at the previous moment.

Figure 7:
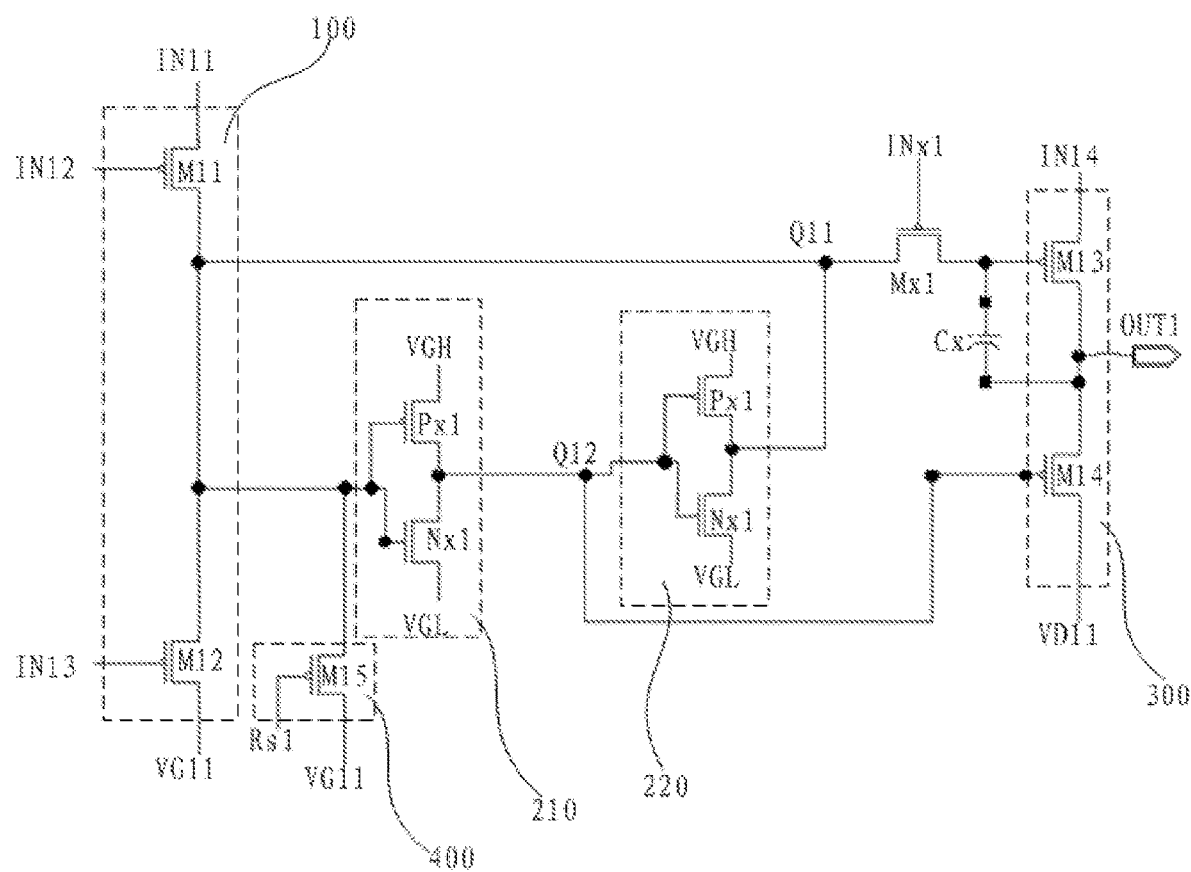
FIG. 7 illustrates another exemplary shift register circuit consistent with various disclosed embodiments in the present disclosure.

Another embodiment of the present disclosure illustrated in FIG. 7 provides another shift register circuit. As illustrated in FIG. 7, the shift register circuit may further include a storage capacitor Cx. A first electrode plate of the storage capacitor Cx may be electrically connected to the first node Q11, and a second electrode plate of the storage capacitor Cx may be electrically connected to the output terminal OUT1 of the output module 300. Optionally, when the shift register circuit includes the conduction transistor Mx1, the first electrode plate of the storage capacitor Cx may be electrically connected to the second terminal of the conduction transistor Mx1 to realize electrical connection to the first node Q11 through the conduction transistor Mx1, which is not specifically limited in the present invention.

The present disclosure also provides a driving method of a shift register circuit. The driving method may be applied to the shift register circuit provided by above embodiments of the present disclosure. The driving method may include a first stage, a second stage, and a third stage sequentially.

In the first stage, the input module may respond to the signal of the second input terminal, to control the first input terminal to be connected to the first node, and the output module may respond to the signal of the first node, to control the fourth input terminal to be connected to the output terminal of the output module.

In the second stage, the output module may respond to the signal of the first node to maintain controlling the fourth input terminal to be connected to the output terminal of the output module.

In the third stage, the input module may respond to the signal of the third input terminal, to control the first electrical-level terminal to be connected to the first node; and the output module may respond to the signal of the second node, to control the first power terminal to be connected to the output terminal of the output module.

The present disclosure has no limit on the types of the transistors in the input module, in the output module, and in the reset module, and the conduction transistor. The transistors may be N-type, or P-type, as long as the transistors satisfy the driving method of the shift register circuit.

FIG. 8 illustrates a timing diagram of a shift register circuit provided by one embodiment of the present disclosure. The embodiment in FIG. 8 is using the shift register circuit shown in FIG. 7 as an example to illustrate the present disclosure. The first transistor M11, the second transistor M12, the third transistor M13, the fourth transistor M14, the fifth transistor M15, and the conduction transistor Mx1 may all be P-type transistors. The enable signals of the first input terminal IN11, the second input terminal IN12, the third input terminal IN13, the fourth input terminal IN14, the on-hold signal terminal INx1, and the reset control signal terminal Rs1 may all be low level. The first electrical-level terminal VG11 may be a fixed high level, and the first power terminal VD11 may be at a fixed high level, where the high level of the first electrical-level terminal VG11 and the high level of the first power terminal VD11 may be the same.

Specifically, in the present embodiment, the driving method may include the first stage K11, the second stage K12, and the third stage K13.

In the first stage K11, the first input terminal IN11 may be at low level, the second input terminal IN12 may be at low level, the third input terminal IN13 may be at high level, and the fourth input terminal IN14 may be at high level. At this time, the first transistor M11 may be turned on in response to the low level of the second input terminal IN12, and may transmit the low level of the first input terminal IN11 to the first node Q11. The low level of the first node Q11 may be transmitted through the conduction transistor Mx1 To the gate of the third transistor M13. The third transistor M13 may be turned on to transmit the high level of the fourth input terminal IN14 to the output terminal OUT1 of the output module 300. And, the first inverter 210 may invert the low level of the first node Q11 to a high level to the second node Q12, and the high level of the second node Q12 may control the fourth transistor M13 to be turned off. Since the driving capability of the first transistor M11 is greater than the driving capability of the P-type transistor in the second inverter 220, when the potential of the first node Q11 is the high level maintained by the P-type transistor in the second inverter connected to the high level, the first transistor M11 can effectively replace the potential of the first node Q11 with the low level of the first input terminal IN11.

In the second stage K12, the first input terminal IN11 may be at a high level, the second input terminal IN12 may be at a high level, the third input terminal IN13 may be at a high level, and the fourth input terminal IN14 may be at a low level. At this time, the first transistor M11 and the second transistor M12 may be both in the off state, and the first inverter 210 and the second inverter 220 may latch the low level of the first node Q11 and the high level of the second node Q12. Further, because of the bootstrap effect of the storage capacitor Cx, the voltage of the first electrode plate of the storage capacitor Cx may be reduced, thereby making the low level of the first node Q11 lower than that in the first stage K11. The third transistor M13 may be maintained in the on state in response to the low level of the first node Q11, and at this time transmit the low level of the fourth input terminal IN14 to the output terminal OUT1 of the output module 300.

In the third stage K13, the first input terminal IN11 may be at a high level, the second input terminal IN12 may be at a high level, the third input terminal IN13 may be at a low level, and the fourth input terminal IN14 may be at a high level. At this time, the first transistor M11 may be still in the off state, and the second transistor M12 may be turned on in response to the low level of the third input terminal IN13, and transmit the high level of the first electrical-level terminal VG11 to the first node Q11. The third transistor M13 may be turned off in response to the high level of the first node Q11. At this time, the second node Q12 may be at a low level, and the fourth transistor M14 may be turned on in response to the low level of the second node Q12, to transmit the high level of the first power terminal VD11 to the output terminal OUT1 of the output module 300. Since the driving capability of the second transistor M12 may be larger than the driving capability of the N-type transistor connected to the low level in the second inverter, at this time, the high level of the first electrical-level terminal VG11 transmitted by the second transistor M12 can effectively replace the low level of the first node Q11 maintained by the N-type transistor connected to the low level in the second inverter 220 in the previous stage.

As shown in FIG. 7 and FIG. 8, in one embodiment, the shift register circuit may further include a reset module 400, and the driving method may further include a reset stage Kx1 before the first stage K11. In the reset stage Kx1, in response to the signal of the reset control signal terminal Rs1, the reset module 500 may control the first electrical-level terminal VG11 to be connected to the first node Q11. That is, in the reset stage Kx1, the first input terminal IN11 and the second input terminal IN12 may both be at the high level, the third input terminal IN13 may be at the high level or low level, the fourth input terminal IN14 may also be at the high level or low level, and the reset control signal terminal Rs1 may be at the low level. The fifth transistor M15 may be turned on in response to the low level of the reset control signal terminal Rs1, and transmit the high level of the first electrical-level terminal VG11 to the first node Q11, to reset the shift register circuit. Since the driving capability of the fifth transistor M15 may be larger than the driving capability of the N-type transistor connected to the low level in the second inverter, when the first node Q11 is at a low level in the previous stage, the high level of the first electrical-level terminal VG11 transmitted by the fifth transistor M15 can effectively replace the low level of the first node Q11 in the previous stage maintained by the N-type transistor connected to the low level in the second inverter.

In one embodiment, the reset stage may be a reset operation on a single shift register circuit. In some other embodiments, the shift register circuit may be applied in a driving circuit composed of multi-level shift register circuits, and correspondingly the reset stage may be a reset stage before the whole driving circuit is turned on.

The present disclosure also provides a display panel. The display panel may include a scanning driving circuit. The scanning driving circuit may include multi-level shift register circuit provided by various embodiments of the present disclosure.

Figure 9:
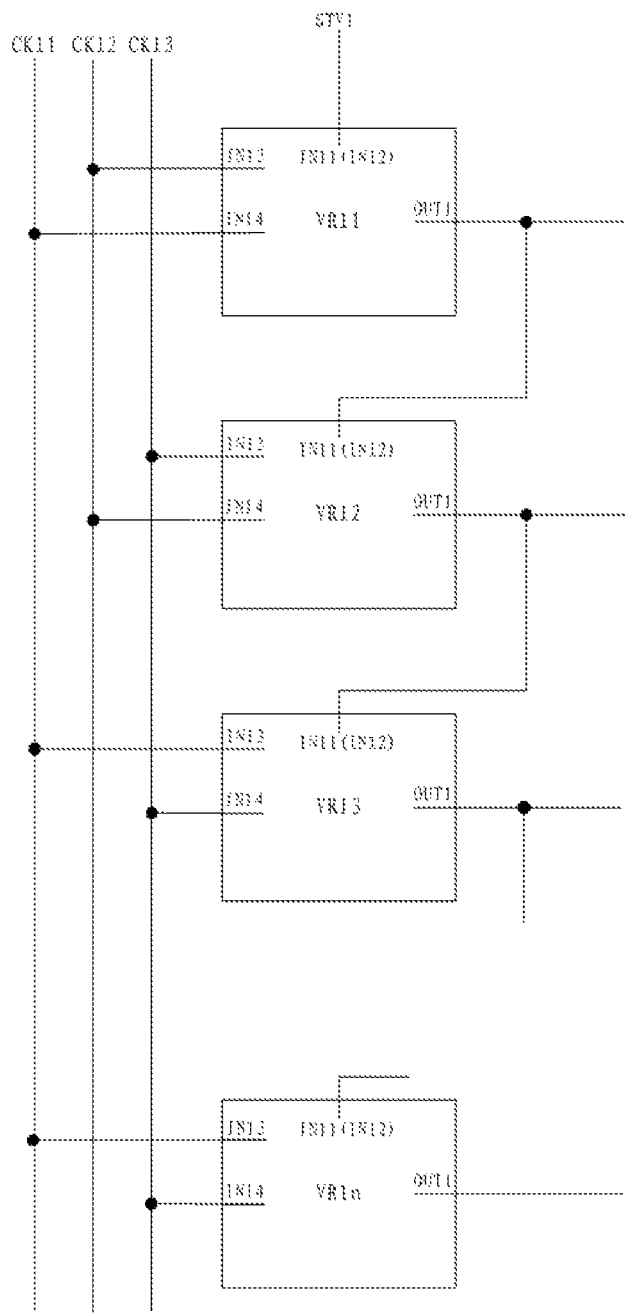
FIG. 9 illustrates an exemplary scanning driving circuit consistent with various disclosed embodiments in the present disclosure.

FIG. 9 illustrates a scanning driving circuit provided by one embodiment of the present disclosure. As illustrated in FIG. 9, the multi-level shift register circuits may be arranged in cascade. The multi-level shift register circuits may include a first-level shift register circuit VR11 to an Nth-level shift register circuit VR1$n$, where N is an integer larger than or equal to 3.

The gate driver circuit may further include a turn-on signal line STV1, a first clock signal line CK11, a second clock signal line CK12, and a third clock signal line CK13. Both a first input terminal IN11 and a second input terminal IN12 of the first-level shift register circuit VR11 may be electrically connected to the turn-on signal line STV1.

Except for the first-level shift register circuit VR11, a first input terminal IN11 and a second input terminal IN12 of each level shift register circuit may be electrically connected to the output terminal OUT1 of the output module of the previous level shift register circuit. For the i-th level shift register circuit, the third input terminal IN13 may be electrically connected to the second clock signal line CK12, and the fourth input terminal IN14 may be electrically connected to the first clock signal line CK11. For the i+1-th stage shift register circuit, the third input terminal IN13 may be electrically connected to the third clock signal line CK13, and the fourth input terminal IN14 may be electrically connected to the second clock signal line CK12. For the i+2 level shift register circuit, the third input terminal IN13 may be electrically connected to the first clock signal line CK11, and the fourth input terminal IN14 may be electrically connected to the third clock signal line CK13, where i=3n+1 with n being an integer greater than or equal to 0, and i+2 being a positive integer less than N. The enable signal segments of the first clock signal line CK11, the second clock signal line CK12, and the third clock signal line CK13 may be sequentially arranged in time.

Figure 10:
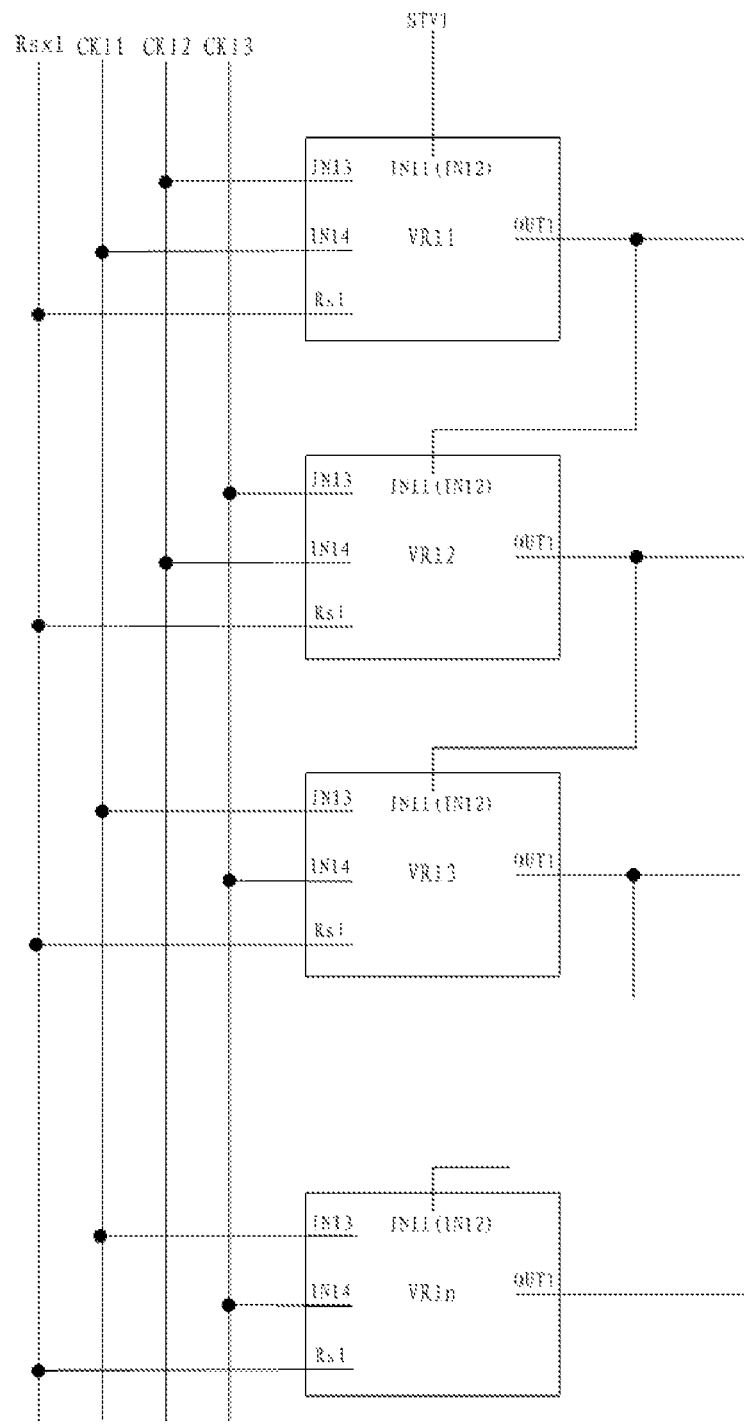
FIG. 10 illustrates another exemplary scanning driving circuit consistent with various disclosed embodiments in the present disclosure.
Figure 11:
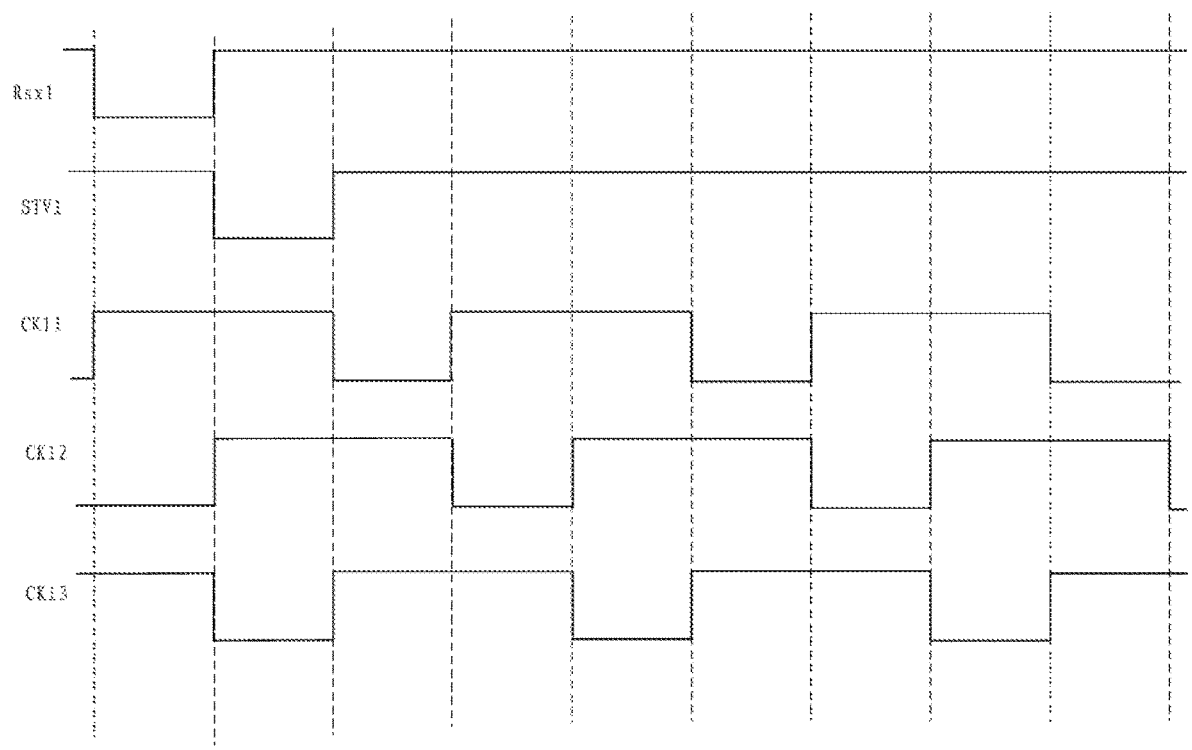
FIG. 11 illustrates an exemplary timing diagram of a scanning driving circuit consistent with various disclosed embodiments in the present disclosure.

Another embodiment shown in FIG. 10 provides another scanning driving circuit. As illustrated in FIG. 10, the shift register circuit may further include a reset module, and the scanning driving circuit may further include a reset control signal line Rsx1. The reset control signal terminals Rs1 of the multiple voltage the shift register circuits may all be electrically connected to the reset control signal line Rsx1. As illustrated in FIG. 11 showing a timing diagram of the scanning driving circuit provided by the present embodiment. For example, the turn-on signal line STV1, the first clock signal line CK11, the second clock signal line CK12, and the third clock signal line CK13, and the reset control signal line Rsx1 may output the enable signals with low level. The reset control signal line Rsx1 may output the low level enable signal before the turn-on signal line STV1 outputs the enable signal. The enable signal segments of the first clock signal line CK11, the second clock signal line CK12, and the third clock signal line CK13 may be sequentially arranged in time. That is, the second clock signal line CK12 outputs the enable signal after the first clock signal line CK11 outputs the enable signal, the third clock signal line CK13 outputs the enable signal after the second clock signal line CK12 outputs the enable signal. After the clock signal line CK12 outputs the enable signal, and the first clock signal line CK11 outputs the enable signal after the third clock signal line CK13 outputs the enable signal, and so on.

Figure 12:
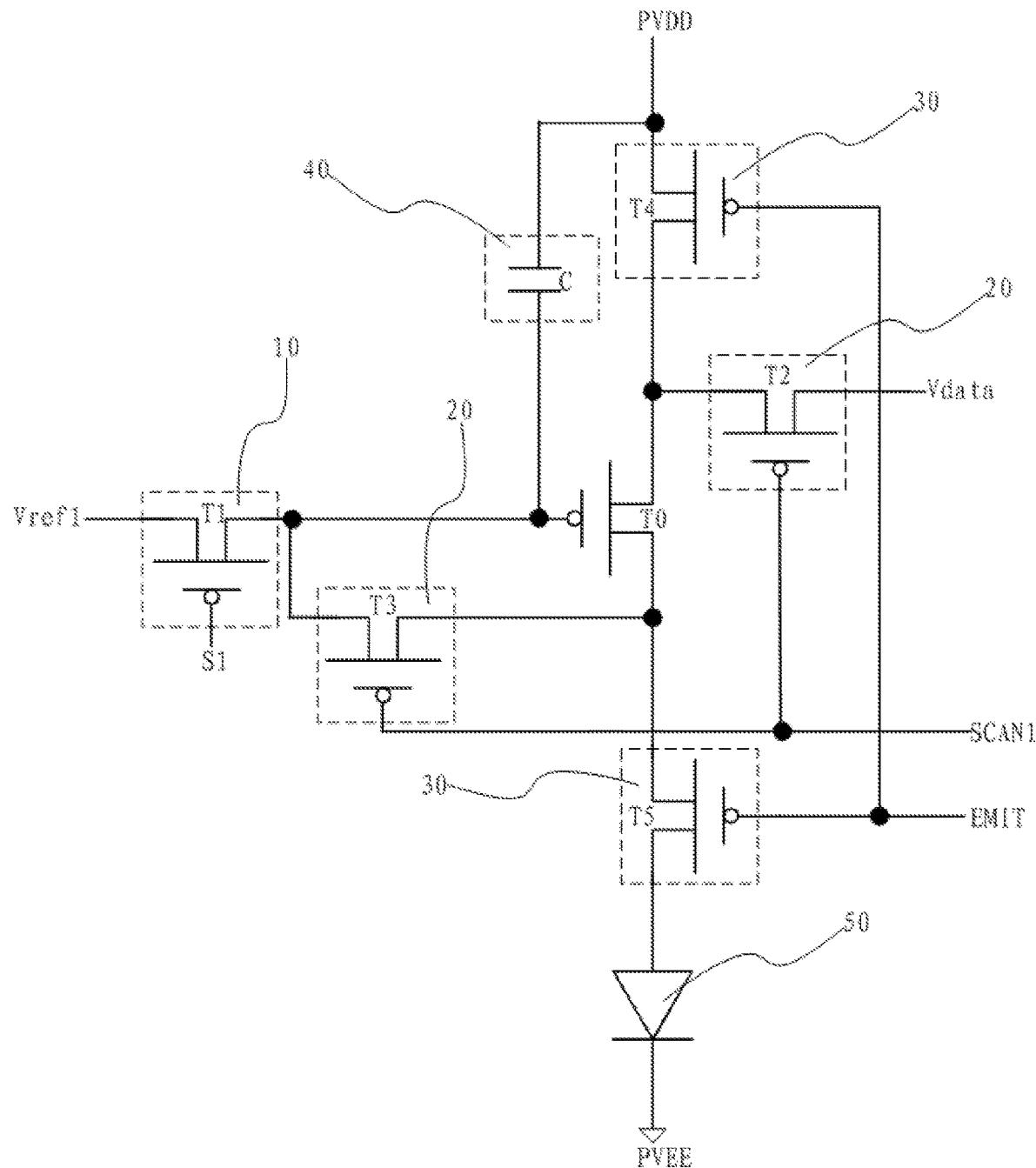
FIG. 12 illustrates an exemplary pixel circuit consistent with various disclosed embodiments in the present disclosure.

In one embodiment, the scanning driving circuit may be used to drive a pixel circuit in a display region of a display device to operate. The pixel circuit may be electrically connected to a light-emitting device. The pixel circuit may include a driving transistor, a plurality of transistors and a plurality of capacitors. All transistors and the plurality of capacitors may cooperate to provide driving current to the light-emitting device, such that the light-emitting device may emit light in response to the driving current. In one embodiment, the scanning driving circuit may be used to provide a scanning driving signal SCAN or a first control signal S1 to the pixel circuit in FIG. 12. Specifically, FIG. 12 illustrates an exemplary pixel circuit provided by one embodiment of the present disclosure. The pixel circuit may include a driving transistor T0, a reset control module 10 electrically connected to the driving transistor T0, a data writing module 20, a light-emitting control module 30, and a storage module 40. The reset control module 10 may be used to transmit a reference voltage Vref to a gate of the driving transistor T0 to reset the gate voltage of the driving transistor T0. The data writing module 20 may be used to write data voltage Vdata into the gate of the driving transistor T0. The light-emitting control module 30 may be used to transmit the driving current generated by the driving transistor T0 to the light-emitting device 50, such that the light-emitting device 50 emits light in response to the driving current. The storage module 40 may be used to maintain the voltage at the gate of the driving transistor T0.

As shown in FIG. 12, in one embodiment, the reset control module 10 may include a reset transistor T1. A first terminal of the reset transistor T1 may be electrically connected to the reference voltage Vref, a gate of the reset transistor T1 may be electrically connected to the first control signal S1, and a second terminal of the reset transistor T1 may be electrically connected to the gate of the driving transistor T0. The data writing module 20 may include a first data writing transistor T2 and a second data writing transistor T3. Gates of the first data writing transistor T2 and the second data writing transistor T3 may be electrically connected to the scan control signal SCAN. A first terminal of the second data writing transistor T3 may be electrically connected to the gate of the driving transistor T0, and a second terminal of the second data writing transistor T3 may be electrically connected to the second terminal of the driving transistor T0. The first terminal of the first data writing transistor T2 may be connected to the data voltage Vdata and the second terminal of the first data writing transistor T2 may be electrically connected to the first terminal of the driving transistor T0. The light-emitting control module 30 may include a first light-emitting control transistor T4 and a second light-emitting control transistor T5. Gates of the first light-emitting control transistor T4 and the second light-emitting control transistor T5 may be electrically connected to the light-emitting control signal EMIT. A first terminal of the first light-emitting control transistor T4 may be electrically connected to the first voltage PVDD, and a second terminal of the first light-emitting control transistor T4 may be electrically connected to the first terminal of the driving transistor T0. A first terminal of the second light-emitting control transistor T5 may be electrically connected to the second terminal of the driving transistor T0, and a second terminal of the second light-emitting control transistor T5 may be electrically connected to the first terminal of the light-emitting device 50. A second terminal of the light-emitting device 50 may be connected to the second voltage PVEE. The storage module 40 may include a capacitor C. A first electrode plate of the capacitor C may be electrically connected to the first voltage PVDD, and a second electrode plate of the capacitor C may be electrically connected to the gate of the driving transistor T0.

Figure 13:
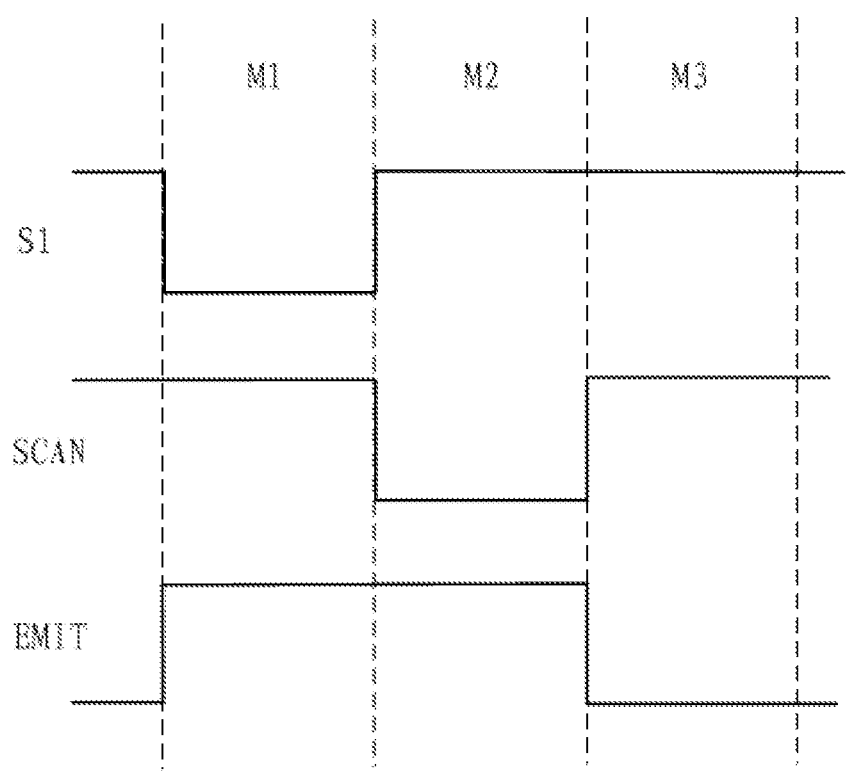
FIG. 13 illustrates an exemplary timing diagram of a pixel circuit consistent with various disclosed embodiments in the present disclosure.

FIG. 13 illustrates a timing diagram of a pixel circuit provided by one embodiment of the present disclosure. For description purposes only, the embodiment in FIG. 13 where all transistors in the pixel circuit are P-type transistors (that is, a transistor is turned on when a gate of the transistor is connected to a control signal with low level, and is turned off when the gate of the transistor is connected to a control signal with high level) will be used as an example to illustrate the present disclosure, and does not limit the scope of the present disclosure. As illustrated in FIG. 12 and FIG. 13, in one embodiment, the operating process of the pixel circuit may include a reset stage M1, a data writing stage M2, and a light-emitting stage M3 performed sequentially.

In the reset stage M1, the reset transistor T1 may be turned on to transmit the reference voltage Vref to the gate of the driving transistor T0, and the transistors of the data writing module 20 and light-emitting control module 30 may all be turned off. The reference voltage Vref may be a voltage able to turn on the driving transistor T0.

In the data writing stage M2, the transistor of the light-emitting control module 30 and the reset transistor may both be turned off, while the first data writing transistor T2 and the second data writing transistor T3 may be turned on. The first data writing transistor T2 may transmit the data voltage Vdata to the first terminal of the driving transistor T0, and the second data writing transistor T3 may connect the gate of the driving transistor T0 to the second terminal of the second data writing transistor T3.

In the light-emitting stage M3, the transistors of the data writing module 20 and the reset transistor T1 may all be turned off, while the first light-emitting control transistor T4 and the second light-emitting control transistor T5 may be turned on to form a conducting path of the first voltage PVDD, the first light-emitting control transistor T4, the driving transistor T0, the second light-emitting control transistor T5, the light emitting device 50, and the second voltage PVEE. The driving current generated by the driving transistor T0 may be transmitted to the light-emitting device 50, and the light-emitting device 50 may emit light in response to the driving current.

For description purposes only, the above embodiment is used as an example to illustrate the present disclosure, and does not limit the scopes of the present disclosure. In various embodiments, the pixel circuit may have any suitable circuit structure. In various embodiments, the driving transistors, reset transistors, data writing transistors, and light-emitting control transistors may all be P-type thin film transistors, or the driving transistors, reset transistors, data writing transistors, and light-emitting control transistors may all be N-type thin film transistors. The first voltage provided by the embodiments of the present disclosure may be the voltage provided by the anode electrical-level terminal, and the second voltage may be the voltage provided by the cathode electrical-level terminal. The light-emitting device may be a light-emitting diode including an inorganic light-emitting diode or an organic light-emitting diode. The present disclosure has no limit on this.

Figure 14:
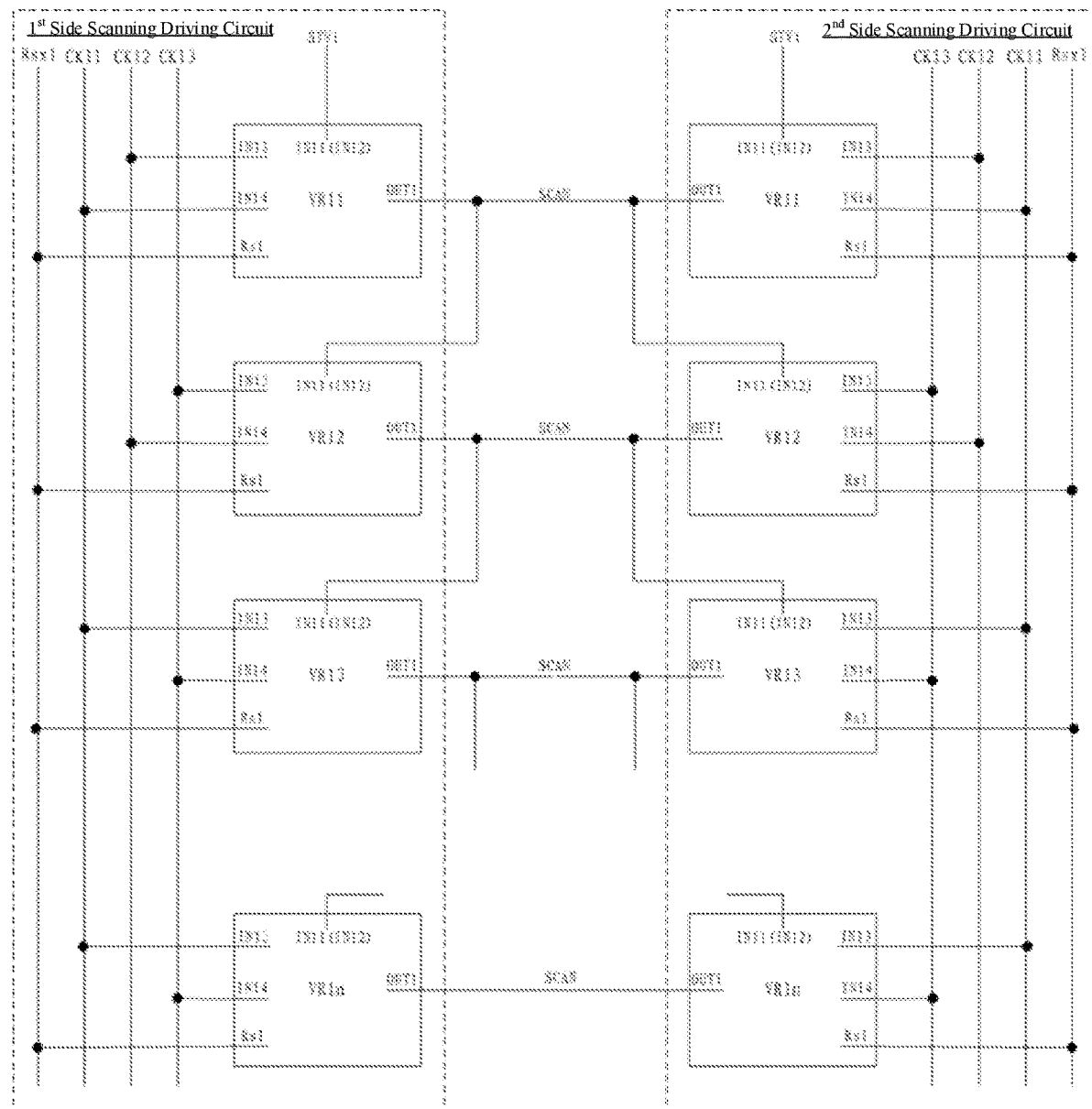
FIG. 14 illustrates an exemplary display panel consistent with various disclosed embodiments in the present disclosure.

The present disclosure also provides a display device. The display device may include any display panel provided by various embodiments of the present disclosure. In one embodiment, the display device may only include a single-side scanning driving circuit. That is, a scanning driving circuit provided by various embodiments of the present disclosure may be disposed at a side of the display region of the display panel, and scanning of all scanning units of the display device may be achieved through the single-side scanning driving circuit. In another embodiment, the display device may include a double-sided scan driving circuit. Specifically, as shown in FIG. 14 showing a schematic structural diagram of the display panel, the display device may include a first side scanning driving circuit and a second side scanning driving circuit opposite to each other. In the first side scanning driving circuit and the second side scanning driving circuit, the output terminals OUT1 of the shift register circuits of a same level may be connected to the same scanning controlling signal line SCAN, thereby improving delay in the transmission of the scanning control signal on the scanning control signal line SCAN.

Figure 15:
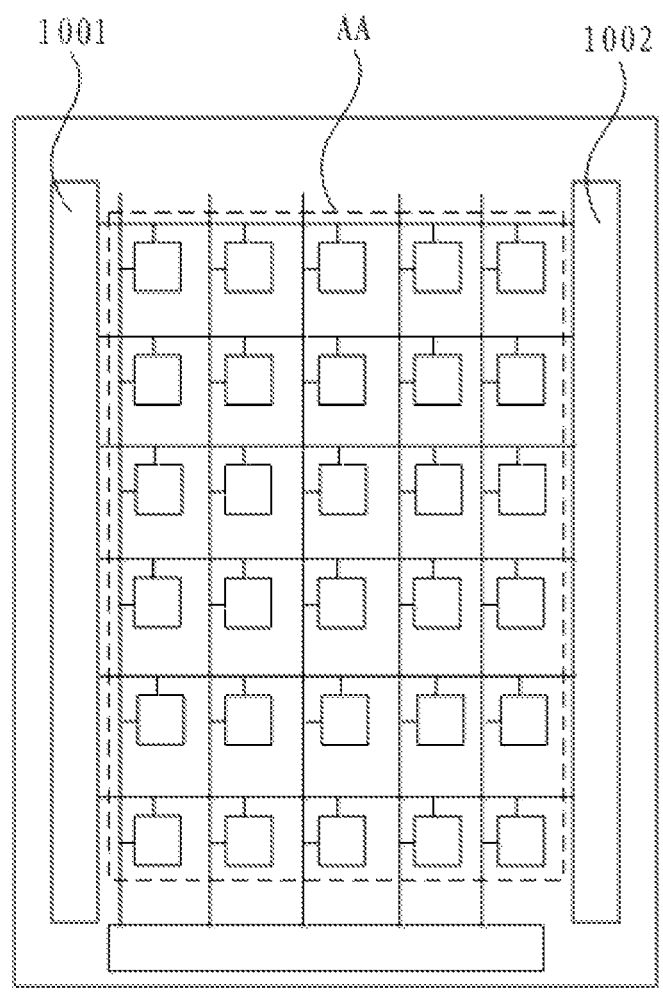
FIG. 15 illustrates another exemplary display panel consistent with various disclosed embodiments in the present disclosure.

Another embodiment of the present disclosure shown in FIG. 15 provides another display panel. As shown in FIG. 15, the display panel may include the double-side scanning driving circuit. The first side scanning driving circuit 1001 and the second side scanning driving circuit 1002 may be disposed at two sides of the display region AA of the display panel respectively.

In various embodiments, the display device provided by the present disclosure may include a mobile terminal, a laptop computer, a tablet computer, a computer, or a wearable device. The present disclosure has no limit on this.

Figure 16:
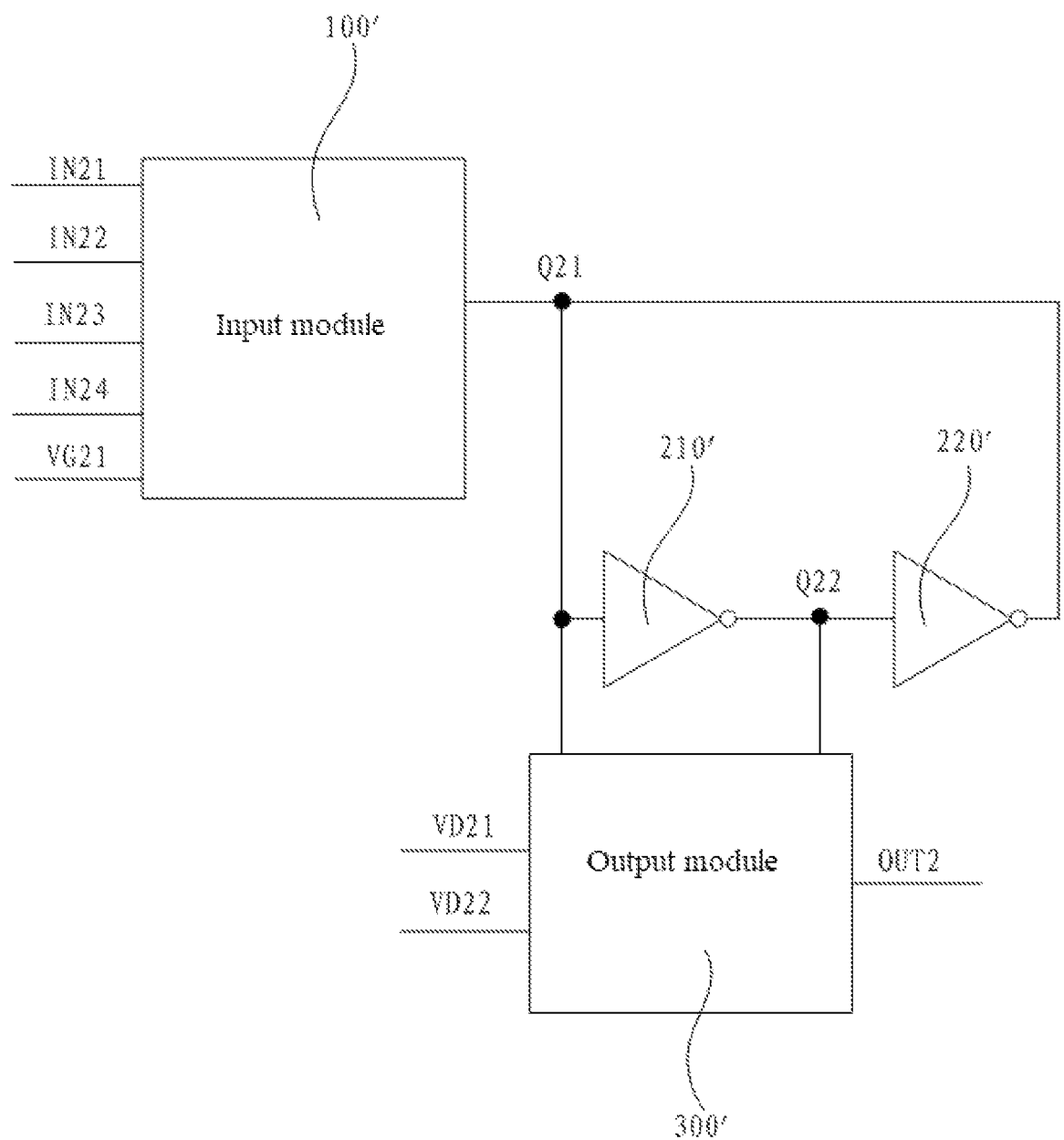
FIG. 16 illustrates another exemplary shift register circuit consistent with various disclosed embodiments in the present disclosure.

Another embodiment of the present disclosure also provides another shift register circuit. As illustrated in FIG. 16, the shift register circuit may include an input module 100', a first inverter 210', a second inverter 220', and an output module 300'.

The input module 100' may be electrically connected to a first input terminal IN21, a second input terminal IN22, a third input terminal IN23, a fourth input terminal IN24, and a first level terminal VG21 for responding to signals of the second input terminal IN22, the third input terminal IN23 and the fourth input terminal IN24 to control the potential of the first node Q21.

An input terminal of the first inverter 210' may be electrically connected to the first node Q21, and an output terminal of the first inverter 210' may be electrically connected to the second node Q22. An input terminal of the second inverter 220' may be electrically connected to the second node Q22, and an output terminal of the second inverter 220' may be electrically connected to the first node Q21.

The output module 300' may be used to respond to the potential of the first node Q21, provide the voltage of the first power terminal VD21 to the output terminal OUT2 of the output module 300'. The output module 300' may be also used to respond to the potential of the second node Q22, to provide the voltage of the second power terminal VD22 to the output terminal OUT2 of the output module 300'. The voltage of the first power terminal VD21 may be lower than the voltage of the second power terminal VD22.

In the shift register circuit provided by the embodiments of the present disclosure, latching of the potential at the first node and the second node may be realized through the first inverter and the second inverter. Correspondingly, the potential stability of the first node and the second node under both low-frequency and high-frequency conditions may be high, thereby ensuring high working stability of the shift register circuit and improving the display effect of the display device.

Figure 17:
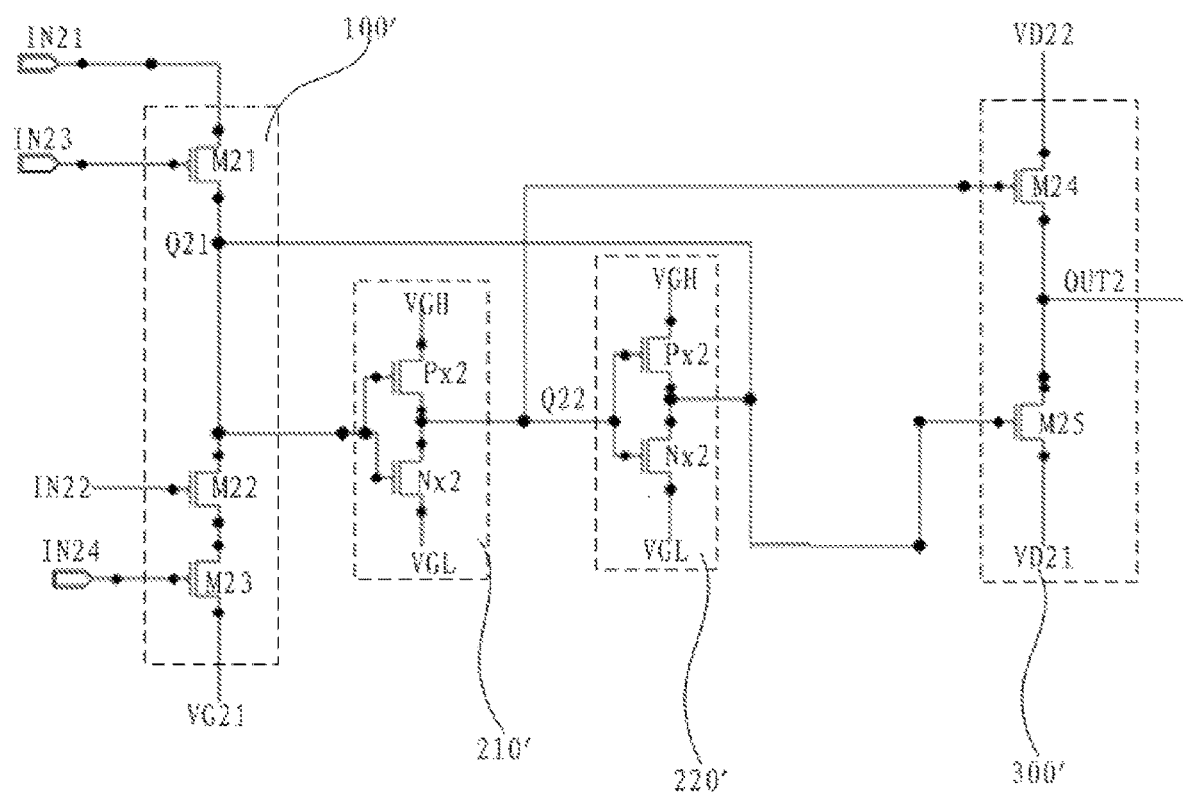
FIG. 17 illustrates another exemplary shift register circuit consistent with various disclosed embodiments in the present disclosure.

FIG. 17 illustrates a structure of a shift register circuit provided by one embodiment of the present disclosure. As illustrated in FIG. 17, at least one inverter of the first inverter 210' and the second inverter 220' may include a P-type transistor Px2 and an N-type transistor Nx2. A gate of the P-type transistor Px2 and a gate of the N-type transistor Nx2 may be electrically connected as the input terminal of the inverter, and a second terminal of the P-type transistor Px2 and a second terminal of the N-type transistor Nx2 may be electrically connected as the output terminal of the inverter. A first terminal of the P-type transistor Px2 may be connected to a high-level signal VGH, and a first terminal of the N-type transistor Nx2 may be connected to a low-level signal VGL.

The first inverter and the second inverter of the present embodiment can refer to the description of the above embodiments.

For example, in one embodiment, the first inverter and the second inverter may include the inverter structure in FIG. 3. In some other embodiments, the first inverter and the second inverter may include other structures. The present disclosure has no limit on this.

In one embodiment, a voltage range of the high level signal VGH may be 6V≤VGH≤14V. For example, the value of VGH may be 8V, or the value of VGH may be 10V. A voltage range of the low level signal VGL can be −14V≤VGL≤−6V. For example, the value of VGL can be −10V, or the value of VGL can be −7V.

In the present disclosure, the first inverter and the second inverter may be connected to each other in an end-to-end manner, and may be electrically connected to the first node and the second node. Correspondingly, the voltage stability of the first node and the second node may be ensured to be high. Also, since the first inverter and the second inverter have strong anti-leakage capabilities, it can further ensure that the voltage stability of the first node and the second node is high, and improve the stability of the shift register circuit. At the same time, only the first inverter and the second inverter may be used to achieve the voltage latching of the first node and the second node. The shift register circuit provided by the embodiments of the present disclosure is simpler than a more complicated circuit.

In one embodiment, the N-type transistor may be a metal oxide transistor. For example, the N-type transistor may be an IGZO (Indium Gallium Zinc Oxide) transistor.

As illustrated in FIG. 17, the input module 100' may respond to the signal of the third input terminal IN23, to provide the signal of the first input terminal IN21 to the first node Q21. The input module 100' may also respond to the signals of the second input terminal IN22 and the signal of the fourth input terminal IN24, to provide the voltage of the first electrical-level terminal VG21 to the first node Q21. The input module 100' may include a first transistor M21, a second transistor M22, and a third transistor M23. A first terminal of the first transistor M21 may be electrically connected to the first input terminal IN21. A gate of the first transistor M21 may be electrically connected to the third input terminal IN23, and a second terminal of the first transistor M11 may be electrically connected to the first node Q21. A first terminal of the second transistor M22 may be electrically connected to the first node Q21, and a gate of the second transistor M12 may be electrically connected to the second input terminal IN22. A first terminal of the third transistor M23 may be electrically connected to a second terminal of the second transistor M22. A gate of the third transistor M23 may be electrically connected to the fourth input terminal IN24, and a second terminal of the first transistor M11 may be electrically connected to the first electrical-level terminal IN24.

Figure 18:
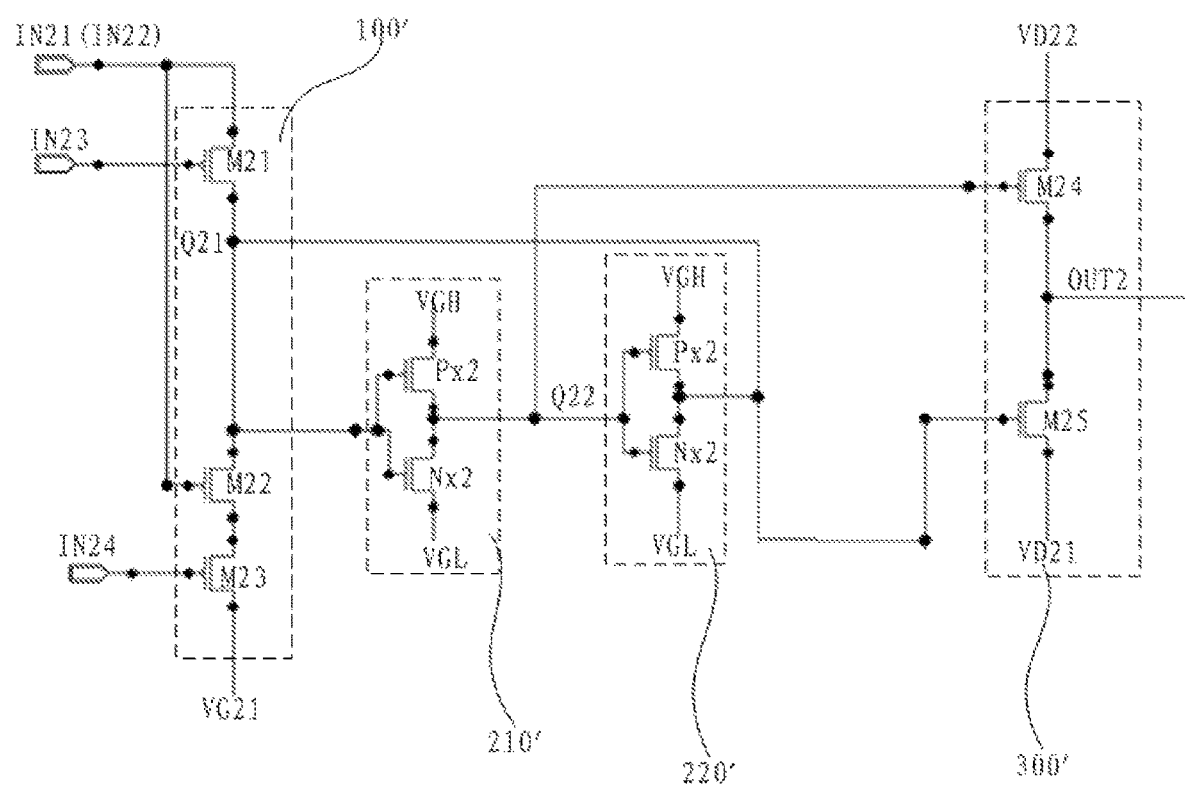
FIG. 18 illustrates another exemplary shift register circuit consistent with various disclosed embodiments in the present disclosure.
Figure 19:
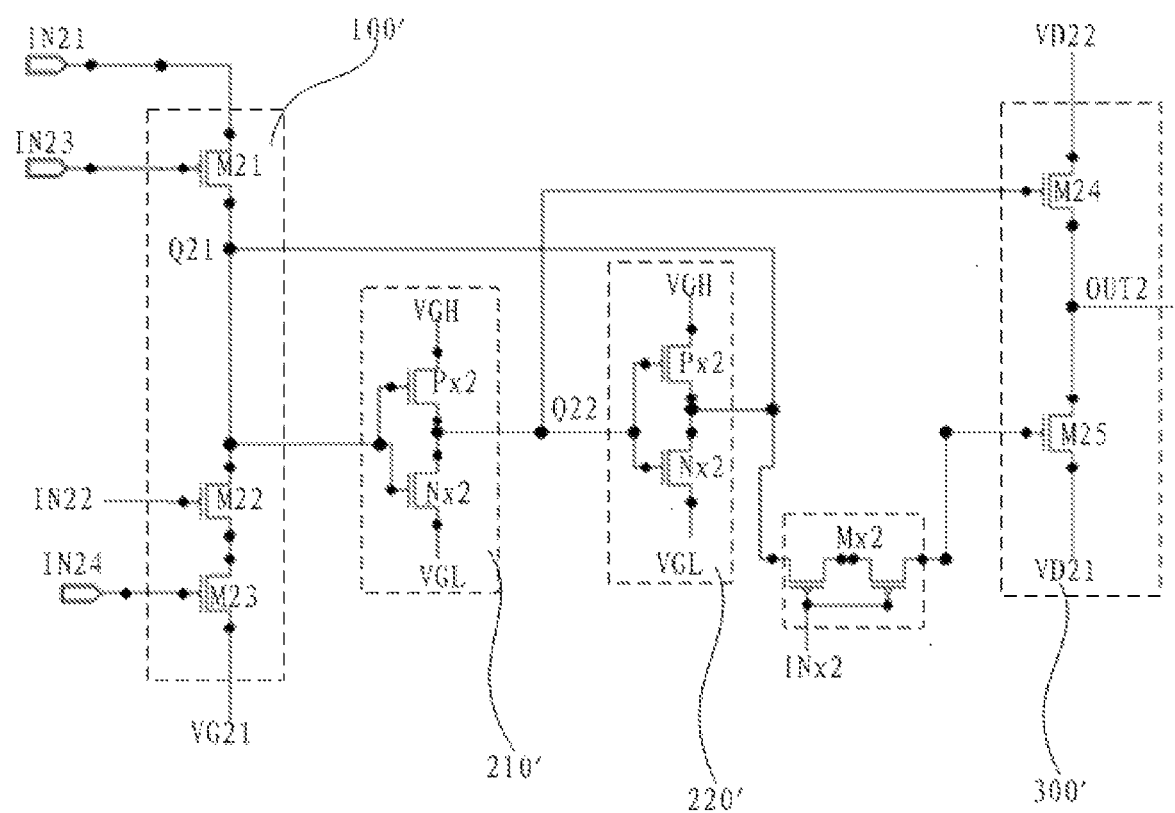
FIG. 19 illustrates another exemplary shift register circuit consistent with various disclosed embodiments in the present disclosure.

In one embodiment, signals of the first input terminal IN21 and the second input terminal IN22 may both be turn-on signals; and a signal of the third input terminal IN23 may be a first clock signal. A signal of the fourth input terminal IN24 may be a second clock signal. As illustrated in FIG. 18 showing another shift register circuit, the signals output by the first input terminal IN21 and the second input terminal IN22 may be same and may be the turn-on signals. Correspondingly, the first input terminal IN21 and the second input terminal IN22 can be connected to a same terminal. Correspondingly, the number of terminals of the shift register circuit may be reduced, and the wiring space of the shift register circuit may be saved. For description purposes only, the embodiment in FIG. 18 where the first input terminal IN21 and the second input terminal IN22 may be connected to a same turn-on signal input terminal is used as an example to illustrate the present disclosure, and does not limit the scope of the present disclosure. In some other embodiments, the first input terminal and the second input terminal may also be configured as two independent terminals need to be specifically designed according to actual applications. Signals of the third input terminal IN23 and the fourth input terminal IN24 may both be clock signals, such that the third input terminal IN23 and the fourth input terminal IN24 can be provided with corresponding clock signals through different clock signal lines.

The duration of the non-enable signal segment of the turn-on signal may be approximately a positive integer multiple of the duration of the unit period. The unit period may refer to the enable signal segment within one clock cycle of the first clock signal, or the unit period may refer to the enable signal segment within one clock cycle of the second clock signal. Optionally, the duration of the enable signal segment of the first clock signal and the duration of the enable signal segment the second clock signal may be the same. Furthermore, when the second input terminal outputs a non-enable signal, the second transistor may be in an off state, such that the input module can keep the path from the first level terminal to the first node disconnected, and the purpose that the shift register circuit is controlled to output the voltage of the first power terminal by the signal of the first electrical-level terminal cannot be achieved. Correspondingly, in one embodiment, controlling the duration of the non-enable signal of the turn-on signal may be used to control a duration of the shift register circuit to maintain the voltage of the second power terminal. For example, when the shift register circuit is used to drive the pixel circuit of a self-luminous display device, the shift register circuit may be used to output a light-emitting control signal, and the voltage of the first power supply terminal may be the voltage at which the light-emitting control signal controls the pixel circuit to light the light-emitting device. The voltage of the second power supply terminals may be the voltage that the light-emitting control signal uses to control the pixel circuit to extinguish the light-emitting device. Therefore, the number of times that the light-emitting device is extinguished in a frame may be controlled by controlling the number of times that the non-enable signal segment of the turn-on signal appears in a frame of the picture. The purpose of dim dimming may be realized, where dim dimming is to control the light-emitting device to turn off the light-emitting device for a preset number of times in a frame of picture, to control the modulation of the light-emitting brightness of the light-emitting device and reduce the flicker of the picture. Further, by controlling the duration of the non-enable signal segment of the turn-on signal, the duration of the second power terminal outputting the light-emitting control signal may be adjusted, to control the duration of the light-emitting device being turned off, and realize the modulation of the light-emitting device's turn-off duration.

Within one clock cycle of the first clock signal, a duration ratio between an enable signal segment and a non-enable signal segment may be approximately 1/2. Within one clock cycle of the second clock signal, a duration ratio between an enable signal segment and a non-enable signal segment may be about 1/2. Specifically, within one clock cycle of the first clock signal, the duration ratio between the enable signal segment and the non-enable signal segment may be at most 1/2, and within one clock cycle of the second clock signal, the duration ratio between the enable signal segment and the non-enable signal segment may be at most 1/2. Specific duration design can be carried out according to actual applications and the present disclosure has no limit on this.

A driving capability of the first transistor may be larger than a driving capability of one of the transistors in the second inverter connected to an electrical-level signal opposite to the non-enable signal output by the first input terminal. The signal of the first input terminal and the signal of the second input terminal may be same, and the non-enable signal of the first input terminal may be the non-enable signal of the second input terminal. For example, when the second transistor is a P-type transistor, the non-enable signal of the first input terminal may be a high level signal. As illustrated in FIG. 18, the driving capability of the first transistor M21 may be larger than the driving capability of the N-type transistor Nx2 in the second inverter. After the high level of the first input terminal is transmitted to the first node, since the potential of the first node at the previous moment is the low level maintained by one of the transistors in the second inverter connected to the low level, the driving capability of the first transistor may be set to be greater than the driving capacity of one of the transistors in the second inverter connected to the low level, to ensure that the low level of the first node at the previous moment can be successfully transformed into the high level of the first input terminal transmitted by the first transistor presently.

Further, in one embodiment, width-length ratios of the transistors may be configured to optimize driving capability of different transistors. The width-length ratio of the first transistor may be larger than the width-length ratio of one of the transistors in the second inverter connected to an electrical-level signal opposite to the non-enable signal output by the first input terminal.

Specifically, as illustrated in FIG. 17, in one embodiment, the fifth transistor M25 may be a P-type transistor, and the non-enable signal of the first input terminal IN21 for turning off the fifth transistor M25 may be a high level signal. The width-length ratio of the first transistor M21 may be larger than the width-length ratio the N-type transistor Nx2 in the second inverter 200' connected to the low level signal VGL. For description purposes only, the present embodiment is used as an example to illustrate the present disclosure, and does not limit the scope of the present disclosure. In various embodiments, any suitable methods may be used to optimize driving capability of different transistors. For example, in some other embodiments, types of different transistors may be configured to make the driving capability of the first transistor larger than the driving capability of one of the transistors in the second inverter connected to an electrical-level signal opposite to the non-enable signal output by the first input terminal. Specifically, the first transistor may be a polycrystalline silicon transistor, and when the one of the transistors in the second inverter connected to an electrical-level signal opposite to the non-enable signal output by the first input terminal is an N-type transistor, the N-type transistor may be an IGZO transistor.

A driving capability of the second transistor and the third transistor connected to each other may be larger than a driving capability of one of the transistors in the second inverter connected to an electrical-level signal opposite to the electrical-level signal output by the first electrical-level terminal, to ensure that the potential of the first node at the previous moment can be successfully transformed into the voltage of the first electrical-level terminal transmitted by the second transistor and the third transistor connected together.

In one embodiment, a width-length ratio of the second transistor and the third transistor connected to each other may be larger than a width-length ratio of one of the transistors in the second inverter connected to an electrical-level signal opposite to the electrical-level signal output by the first electrical-level terminal. A width of the channel of the second transistor may be a2 and a length of the channel of the second transistor may be b2. A width of the channel of the third transistor may be a3 and a length of the channel of the third transistor may be b3. The width-length ratio of the second transistor and the third transistor connected to each other may be 1/(b2/a2+b3/a3). The width-length ratio 1/(b2/a2+b3/a3) may be larger than a width-length ratio of one of the transistors in the second inverter connected to an electrical-level signal opposite to the electrical-level signal output by the first electrical-level terminal. As illustrated in FIG. 17, in one embodiment, the second transistor M22 and the third transistor M23 may both be P-type transistors, and the electrical-level signal of the first electrical-level terminal VG21 may be a low level signal. The width-length ratio of the second transistor M22 and the third transistor M23 connected together may be larger than the width-length ratio the P-type transistor Px2 in the second inverter connected to the high level signal VGH. For description purposes only, the present embodiment is used as an example to illustrate the present disclosure, and does not limit the scope of the present disclosure. In various embodiments, any suitable methods may be used to optimize driving capability of different transistors. For example, in some other embodiments, types of different transistors may be configured to make the driving capability of the second transistor larger than the driving capability of one of the transistors in the second inverter connected to an electrical-level signal opposite to the electrical-level signal output by the first electrical-level terminal. Specifically, the second transistor and the third transistor may be polycrystalline silicon transistors, and when the one of the transistors in the second inverter connected to an electrical-level signal opposite to the electrical-level signal output by the first electrical-level terminal is an N-type transistor, the N-type transistor may be an IGZO transistor.

As illustrated in FIG. 17, the output module 300' may include a fourth transistor M24 and a fifth transistor M25. A first terminal of the fourth transistor M24 may be electrically connected to the second power terminal VD22, a second terminal of the fourth transistor M24 may be electrically connected to the output terminal OUT2 of the output module 300', and a gate of the fourth transistor M24 may be electrically connected to the second node Q22. A first terminal of the fifth transistor M25 may be electrically connected to the first power terminal VD21, a second terminal of the fifth transistor M25 may be electrically connected to the output terminal OUT2 of the output module 300', and a gate of the fourth transistor M14 may be electrically connected to the first node Q21.

In one embodiment illustrated in FIG. 5, the shift register circuit may further include: a conduction transistor Mx2 electrically connected between the first node Q21 and the output module 300'. A first terminal of the conduction transistor Mx2 may be electrically connected to the first node Q21, a second terminal of the conduction transistor Mx2 may be electrically connected to the output module 300', and a gate of the conduction transistor Mx2 may be electrically connected to an on-hold signal terminal Inx2. The conduction transistor Mx2 may be configured to respond to a signal of the on-hold signal terminal Inx2, to control the conduction transistor Mx2 to maintain a turn-on state. For example, the conduction transistor Mx2 may be a P-type transistor. Correspondingly, the signal of the on-holding signal terminal Inx2 may be low level, such that the conduction transistor Mx2 may maintain a normally-on state. Alternatively, in another embodiment, the conduction transistor Mx2 may be an N-type transistor. Correspondingly, the signal of the on-hold signal terminal Inx2 may be high level, such that the conduction transistor Mx2 may maintain a normally-on state. The on-hold signal terminal Inx2 provided in the embodiment of the present disclosure may be configured to maintain the turn-on state of the conduction transistor Mx2, such that the conduction state between the first node Q21 and the output module 300' is maintained.

As illustrated in FIG. 14, when the output module 300' includes the circuit structure in FIG. 13, the first terminal of the conduction transistor Mx2 may be electrically connected to the first node Q21, the second terminal of the conduction transistor Mx2 may be electrically connected to the gate of the fifth transistor M25. Correspondingly, the connection between the first node Q21 and the gate of the fifth transistor M25 may be maintained by the conduction transistor Mx2. In one embodiment, the conduction transistor Mx2 may be two sub transistors connected in series between the first node 21 and the output module 300'. The two sub transistors of the conduction transistor Mx2 may have a same conductive type, and gates of the two sub transistors may be connected to a same terminal. In the present disclosure, by providing the conduction transistor Mx2, when the gate of the fifth transistor M25 changes from the high level to a higher voltage, or changes from the low level to a lower voltage, the changing voltage transmitted to the first node Q21 may be improved, to reduce the influence of the voltage change of the gate of the fifth transistor M25 on the potential of the first node Q21. The voltage stability of the first node Q21 and the stability of the shift register circuit may be improved. In the shift register circuit shown in FIG. 22, a second storage capacitor Cx22 may be connected between the gate of the fifth transistor M25 and the output terminal of the output module 300'. When the second storage capacitor Cx22 is bootstrapped, if the gate of the fifth transistor M25 changes from the high level to a higher voltage, or changes from the low level to a lower voltage, the conduction transistor Mx2 may improve the changing voltage transmitted to the first node Q21, to reduce the influence of the voltage change of the gate of the fifth transistor M25 on the potential of the first node Q21.

Figure 20:
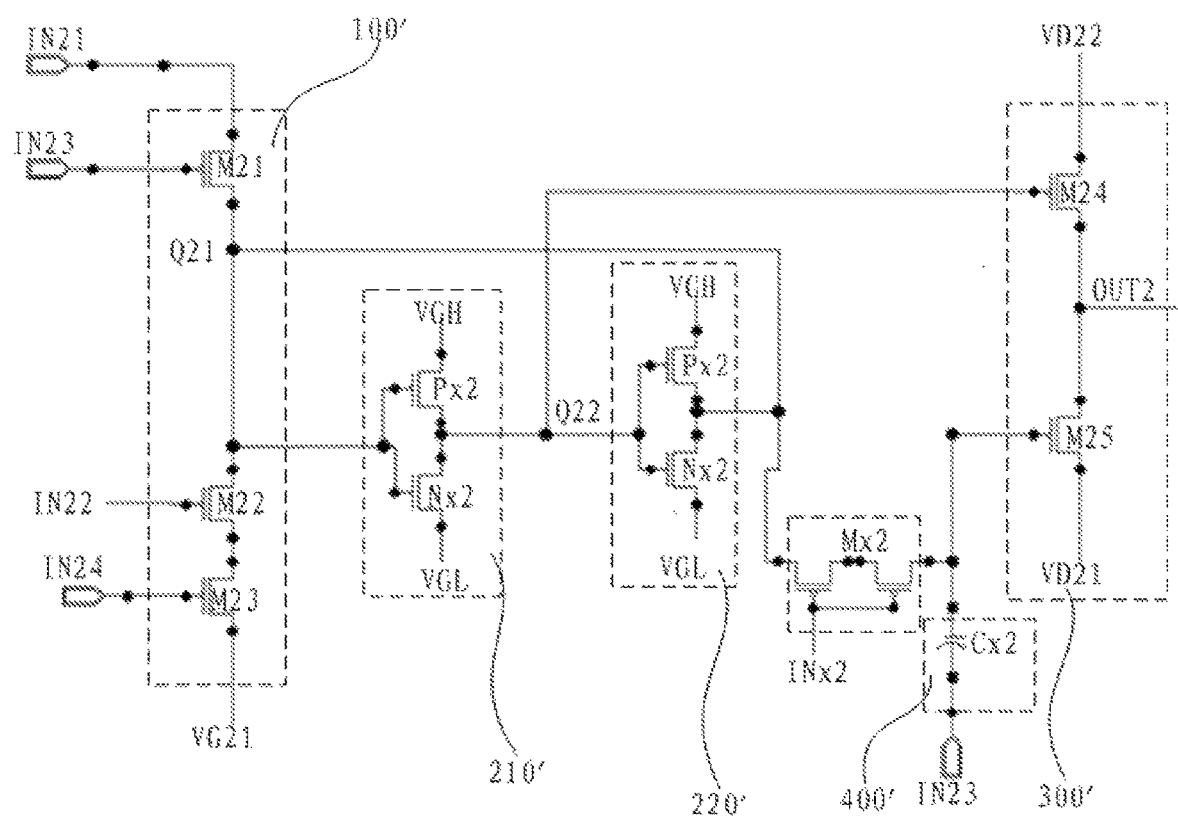
FIG. 20 illustrates another exemplary shift register circuit consistent with various disclosed embodiments in the present disclosure.

As illustrated in FIG. 20, in one embodiment, the shift register circuit may further include a voltage pump module 400' electrically connected to the first node Q21, and the voltage pump module 400' may be connected between the first node Q21 and the third input terminal IN23. The voltage pump module 400' may include a capacitor Cx2. A first electrode plate of the capacitor Cx2 may be electrically connected to the first node Q21, and a second electrode plate of the capacitor Cx2 may be electrically connected to the third input terminal IN23. When the output module 300' of the shift register circuit includes the fourth transistor M24 and the fifth transistor M25, the first electrode plate of the capacitor Cx2 may be electrically connected to the gate of the fifth transistor M25. Furthermore, the voltage pump module may be used to further keep the voltage at the first node Q21 stable.

As illustrated in FIG. 20, in the present embodiment, the shift register circuit may include the conduction transistor Mx2. The voltage pump module 400' may be connected to the second terminal of the conduction transistor Mx2, to achieve an indirect electrical connection to the first node Q21. That is, the voltage pump module 400' may include the capacitor Cx2. The first electrode plate of the capacitor Cx2 may be electrically connected to the second terminal of the conduction transistor Mx2, and the second electrode plate of the capacitor Cx2 may be electrically connected to the third input terminal IN23.

Figure 21:
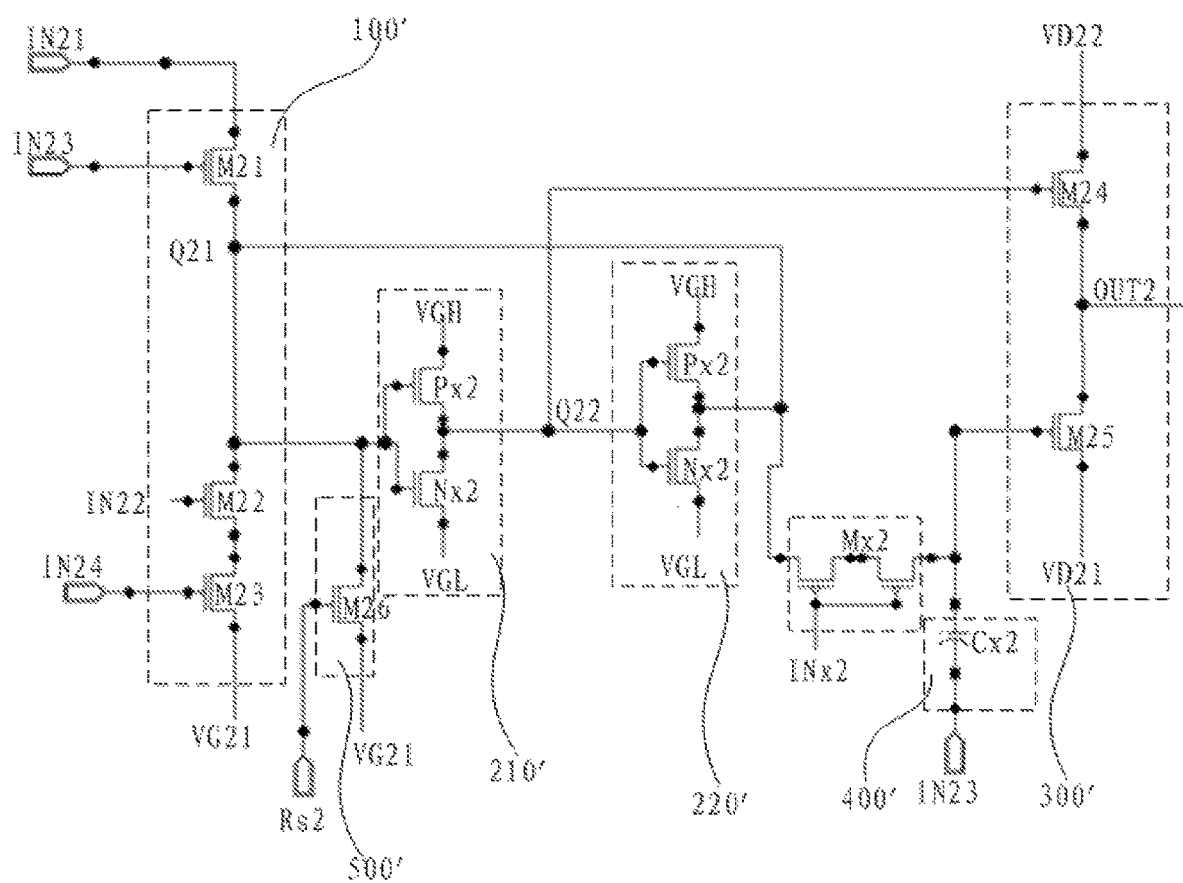
FIG. 21 illustrates another exemplary shift register circuit consistent with various disclosed embodiments in the present disclosure.

As illustrated in FIG. 21, in one embodiment, the shift register circuit may further include a reset module 500'. The reset module 500' may be electrically connected to the first node Q21, a reset control signal terminal Rs2, and the first electrical-level terminal VG21. The reset module 500' may be configured to respond to a signal of the reset control signal terminal Rs2, to transmit the voltage of the first electrical-level terminal VG21 to the first node Q21. The reset module 500' may include a sixth transistor M26. In the sixth transistor M26, a first terminal may be electrically connected to the first electrical-level terminal VG21, a second terminal may be electrically connected to the first node Q21, and a gate may be electrically connected to the reset control signal terminal Rs2. By using the reset module 500' to perform signal reset to the shift register circuit, accuracy of the signal during the operation of the shift register circuit may be guaranteed to be high. The driving capability of the sixth transistor may be larger than the driving capability of one of the transistors in the second inverter connected to an electrical-level signal opposite to the electrical-level signal output by the first electrical-level terminal. Correspondingly, it may be ensured that after the first inverter inverts the electrical-level signal transmitted by the sixth transistor the second inverter can effectively invert the electrical-level signal output by the first inverter.

Figure 22:
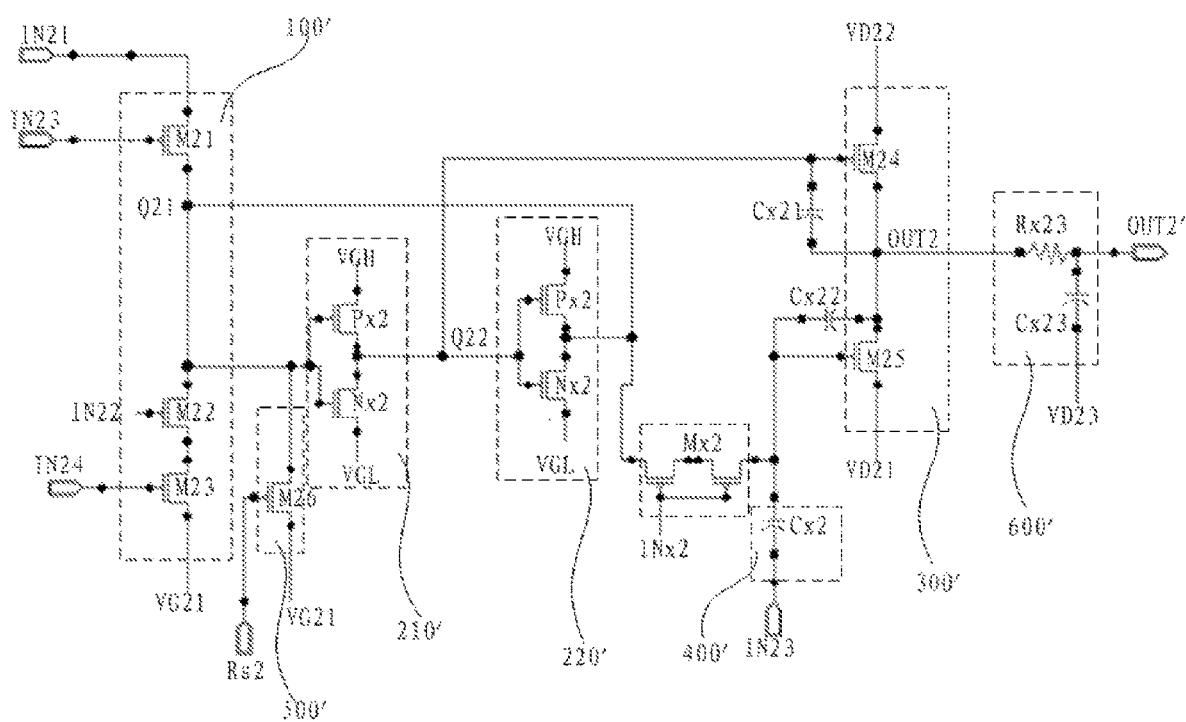
FIG. 22 illustrates another exemplary shift register circuit consistent with various disclosed embodiments in the present disclosure.

As illustrated in FIG. 22, in one embodiment, the shift register circuit may further include a first storage capacitor Cx21 and a second storage capacitor Cx22. A first electrode plate of the first storage capacitor Cx21 may be electrically connected to the second node Q22, and a second electrode plate of the first storage capacitor Cx21 may be electrically connected to the output terminal OUT2 of the output module 300'. A first electrode plate of the second storage capacitor Cx22 may be electrically connected to the first node Q21, and a second electrode plate of the second storage capacitor Cx22 may be electrically connected to the output terminal OUT2 of the output module 300'.

As illustrated in FIG. 22, in one embodiment, the shift register circuit may further include a filter module 600' electrically connected to the output terminal OUT2 of the output module 300'. The filter module 600' may include a filter resistor Rx23 and a filter capacitor CX23. A first terminal of the filter resistor Rx23 may be electrically connected to the output terminal OUT2 of the output module 300', and a second terminal of the filter resistor Rx23 may be electrically connected to the output terminal OUT2' of the shift register circuit. A first electrode plate of the filter capacitor Cx23 may be electrically connected to the second terminal of the filter resistor RX23, and a second electrode plate of the filter capacitor Cx23 may be electrically connected to the third power terminal VD23. Correspondingly, the filter module 600' may be used to optimize the output of the shift register circuit.

The present disclosure also provides a driving method of a shift register circuit. The driving method may be applied to the shift register circuit provided by above embodiments of the present disclosure. The driving method may include a first stage, a second stage, and a third stage sequentially.

In the first stage, the input module may respond to the signal of the third input terminal, to control the first input terminal to be connected to the first node, and the output module may respond to the signal of the second node, to control the second power terminal to be connected to the output terminal of the output module.

In the second stage, the output module may respond to the signal of the second node to maintain controlling the second power terminal to be connected to the output terminal of the output module.

In the third stage, the input module may respond to the signal of the second input terminal and the fourth input terminal, to control the first electrical-level terminal to be connected to the first node; and the output module may respond to the signal of the first node, to control the first power terminal to be connected to the output terminal of the output module.

The present disclosure has no limit on types of the transistors in the input module, in the output module, and in the reset module, and the conduction transistor. The transistors may be N-type, or P-type, as long as the transistors satisfy the driving method of the shift register circuit.

Figure 23:
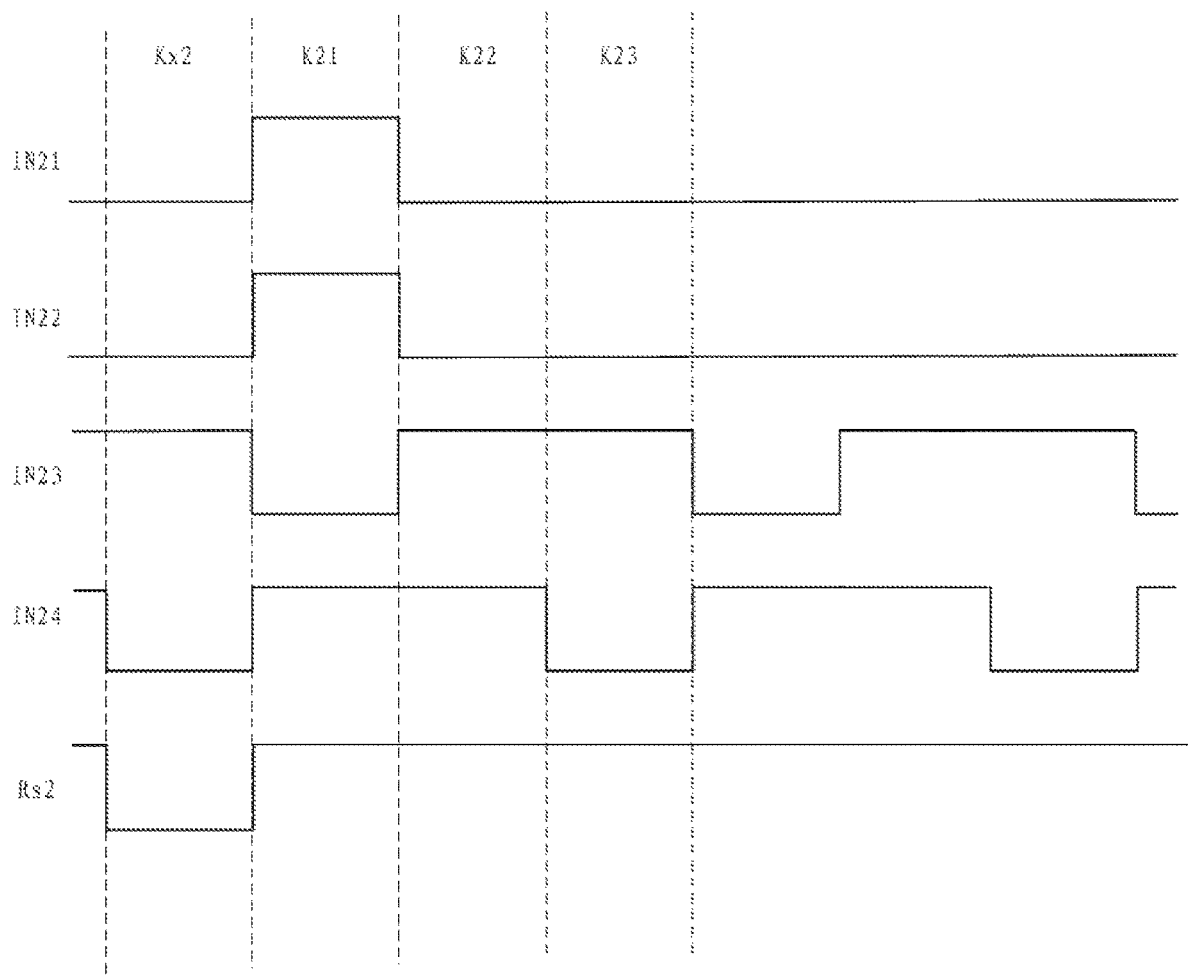
FIG. 23 illustrates another exemplary timing diagram of a shift register circuit consistent with various disclosed embodiments in the present disclosure.

FIG. 23 illustrate a timing diagram of a shift register circuit provided by one embodiment of the present disclosure. The embodiment in FIG. 23 is using the shift register circuit shown in FIG. 22 as an example to illustrate the present disclosure. The first transistor M21, the second transistor M22, the third transistor M23, the fourth transistor M24, the fifth transistor M25, the sixth transistor M26, and the conduction transistor Mx1 may all be P-type transistors. The enable signals of the first input terminal IN21, the second input terminal IN22, the third input terminal IN23, the fourth input terminal IN24, the on-hold signal terminal Inx2, and the reset control signal terminal Rs2 may all be low level. The non-enable signal of the first input terminal IN21 may be high level. The first electrical-level terminal VG21 may be a fixed low level, and the first power terminal VD21 may be at a fixed low level, and the second power terminal VD22 may be at a fixed high level. The voltage of the first electrical-level terminal VG21 and the voltage of the first power terminal VD21 may be the same.

Specifically, in the present embodiment, the driving method may include the first stage K21, the second stage K22, and the third stage K23.

In the first stage K21, the first input terminal IN21 may be at high level, the second input terminal IN22 may be at high level, the third input terminal IN23 may be at low level, and the fourth input terminal IN24 may be at high level. At this time, the first transistor M21 may be turned on in response to the low level of the third input terminal IN23, and may transmit the high level of the first input terminal IN21 to the first node Q21. The high level of the first node Q21 may be inverted by the first inverter 210' to make the second node Q22 at low level. The low level of the second node Q22 may be transmitted to the gate of the fourth transistor M24, to turn on the fourth transistor M24. The fourth transistor M24 may transmit the high level of the second power terminal VD22 to the output terminal OUT2 of the output module 300', and then the voltage may be output after being filtered by the filter module 600'. Since the non-enable signal of the first transistor M21 may be high level and the driving capability of the first transistor M21 is greater than the driving capability of the N-type transistor in the second inverter 220', when the potential of the first node Q21 is the low level maintained by the N-type transistor in the second inverter 220' connected to the low level, the first transistor M21 can effectively replace the potential of the first node Q21 with the high level of the first input terminal IN21.

In the second stage K22, the third input terminal IN23 may be at a high level, the fourth input terminal IN24 may be at a high level. At this time, the first transistor M21 and the third transistor M23 may be both in the off state. Correspondingly, the first input terminal IN21 and the second input terminal IN22 may be at the high level or the low level. The first inverter 210' and the second inverter 220' may latch the high level of the first node Q21 and the low level of the second node Q22. Further, the low level of the second node Q22 may be transmitted to the gate of the fourth transistor M24 to turn on the fourth transistor M24. Correspondingly, the fourth transistor M24 may transmit the high level of the second power terminal VD22 to the output terminal OUT2 of the output module 300', and the voltage then may be output after being filtered by the filter module 600'.

In the third stage K23, the first input terminal IN21 may be at a low level, the second input terminal IN22 may be at a low level, the third input terminal IN23 may be at a high level, and the fourth input terminal IN24 may be at low level. At this time, the second transistor M22 and the third transistor M23 may be turned on in response to the low level of the second input terminal IN23 and the low level of the fourth input terminal IN24 respectively, to transmit the low level of the first electrical-level terminal VG21 to the first node Q21. The first node Q21 may transmit the low level to the gate of the fifth transistor M25 through the conduction transistor Mx2, to turn on the fifth transistor. The fifth transistor M25 may transmit the low level of the first power terminal VD21 to the output terminal OUT2 of the output module 300', and then the voltage may be output after being filtered by the filter module 600'. Since the driving capability of the second transistor M22 and the third transistor M23 may be larger than the driving capability of the P-type transistor connected to the high level in the second inverter, at this time, the low level of the first electrical-level terminal VG21 transmitted by the second transistor M22 and the third transistor M23 can effectively replace the high level of the first node Q21 maintained by the P-type transistor connected to the high level in the second inverter 220' in the previous stage.

In one embodiment, the non-enable period of the turn-on signals provided by the first input terminal IN21 and the second input terminal IN22 corresponding to the signals of each of the input terminals in the second stage and the third stage may have a duration equal to a unit period. In another embodiment, when the non-enable period of the turn-on signals provided by the first input terminal IN21 and the second input terminal IN22 corresponding to the signals of each of the input terminals in the second stage and the third stage may have a duration different from a unit period, the signals of each of the input terminals in the second stage and the third stage may be different from the above description. For example, in one embodiment, the first input terminal IN21 and the second input terminal IN22 may provide the high level, while the third input terminal IN23 may provide high or low level and the fourth input terminal IN24 may provide high or low level.

As shown in FIG. 22 and FIG. 23, in one embodiment, the shift register circuit may further include a reset module 500', and the driving method may further include a reset stage Kx2 before the first stage K21. In the reset stage Kx2, in response to the signal of the reset control signal terminal Rs2, the reset module 500' may control the first electrical-level terminal VG21 to be connected to the first node Q21, to transmit the low level of the first electrical-level terminal VG21 to the first nod Q21, to reset the shift register circuit. Since the driving capability of the sixth transistor M26 may be larger than the driving capability of the P-type transistor connected to the high level in the second inverter, when the first node Q21 is at the high level in the previous stage, the low level of the first electrical-level terminal VG21 transmitted by the sixth transistor M26 can effectively replace the high level of the first node Q21 in the previous stage maintained by the P-type transistor connected to the high level in the second inverter.

In one embodiment, the reset stage may be a reset operation on a single shift register circuit. In some other embodiments, the shift register circuit may be applied in a driving circuit composed of multi-level shift register circuits, and correspondingly the reset stage may be a reset stage before the whole driving circuit is turned on.

Figure 24:
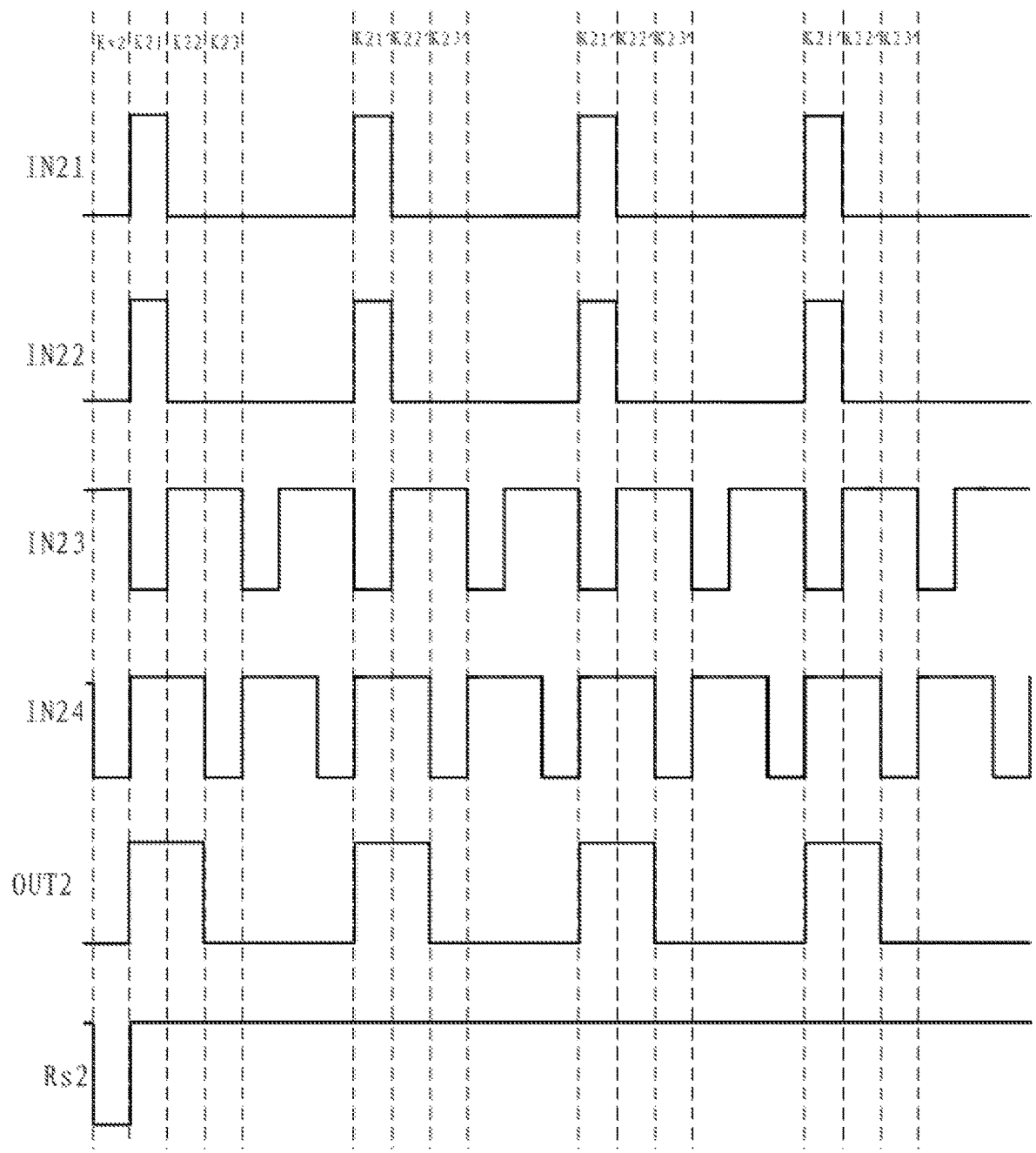
FIG. 24 illustrates another exemplary timing diagram of a shift register circuit consistent with various disclosed embodiments in the present disclosure.

The shift register circuit may be used to drive a pixel circuit of a self-luminous display device, and in one frame of picture and after the third stage, the driving method may repeat the process of the first stage, the second stage, and the third stage many times to achieve a purpose of dim dimming. As illustrated in FIG. 24, in one embodiment, according to requirements, the first input terminal IN21 (that is, the second input terminal IN22) can be used to provide the non-enable signal segment of the turn-on signal to the shift register circuit (where the non-enable signal segment is the high level segment) several times, to repeat the first stage to the third stage several times (as shown in FIG. 24, the first stage K21, the second stage K22 and the third stage K23, and the repeated first stage K21', the second stage K22' and the third stage K23'), to realize the rolling output of the shift register circuit.

As illustrated in FIG. 24, the duration of the non-enable signal segment (the non-enable signal segment may be the high level signal segment) in the turn-on signals provided by the first input terminal IN21 (that is, the second input terminal IN22) several times may be same or different. This can be configured according to the duration of the voltage of the second power terminal VD22 output by the output terminal 2 of the shift register circuit in the actual application. The duration of the non-enable signal segment of the turn-on signal provided by the first input terminal and the second input terminal may be a positive integer multiple of the duration of the unit period, for example, may be one time, two times, or three times of the duration of the unit period. The unit period may refer to the enable signal segment within one clock cycle of the first clock signal (the signal of the third input terminal), or the unit period may refer to the enable signal segment within one clock cycle of the second clock signal (the signal of the fourth input terminal). Optionally, the duration of the enable signal segment of the first clock signal and the duration of the enable signal segment the second clock signal may be the same. Furthermore, when the second input terminal outputs a non-enable signal, the second transistor may be in an off state, such that the input module can keep the path from the first level terminal to the first node disconnected, and the purpose that the shift register circuit is controlled to output the voltage of the first power terminal by the signal of the first electrical-level terminal cannot be achieved. Correspondingly, in one embodiment, controlling the duration of the non-enable signal of the turn-on signal may be used to control a duration of the shift register circuit to maintain the voltage of the second power terminal. For example, when the shift register circuit is used to drive the pixel circuit of a self-luminous display device, the shift register circuit may be used to output a light-emitting control signal, and the voltage of the first power supply terminal may be the voltage at which the light-emitting control signal controls the pixel circuit to light the light-emitting device. The voltage of the second power supply terminals may be the voltage that the light-emitting control signal uses to control the pixel circuit to extinguish the light-emitting device. Therefore, the number of times that the light-emitting device is extinguished in a frame may be controlled by controlling the number of times that the non-enable signal segment of the turn-on signal appears in a frame of the picture. The purpose of dim dimming may be realized, where dim dimming is to control the light-emitting device to turn off the light-emitting device for a preset number of times in a frame of picture, to control the modulation of the light-emitting brightness of the light-emitting device and reduce the flicker of the picture. Further, by controlling the duration of the non-enable signal segment of the turn-on signal, the duration of the second power terminal outputting the light-emitting control signal may be adjusted, to control the duration of the light-emitting device being turned off, and realize the modulation of the light-emitting device's turn-off duration. For example, in the light-emitting phase, the setting rule for the multiple duration for turning off the light-emitting device inserted in the light-emitting control signal may be sequentially increasing, sequentially decreasing, or alternately setting of a longer duration and a shorter duration, and so on.

For description purposes only, the embodiment in FIG. 24 where intervals between any two adjacent pulses output by the first input terminal IN21 are same is used as an example to illustrate the present disclosure, and does not limit the scope of the present disclosure. In some other embodiments, times of each pulse output by the first input terminal IN21 can be configured according to actual needs, such that the intervals between two adjacent pulses output by the first input terminal IN21 may be different. For example, the intervals may increase sequentially, decrease sequentially, or be alternately setting of long intervals and short intervals.

The present disclosure also provides a display panel. The display panel may include a scanning driving circuit. The scanning driving circuit may include multi-level shift register circuit provided by various embodiments of the present disclosure.

Figure 25:
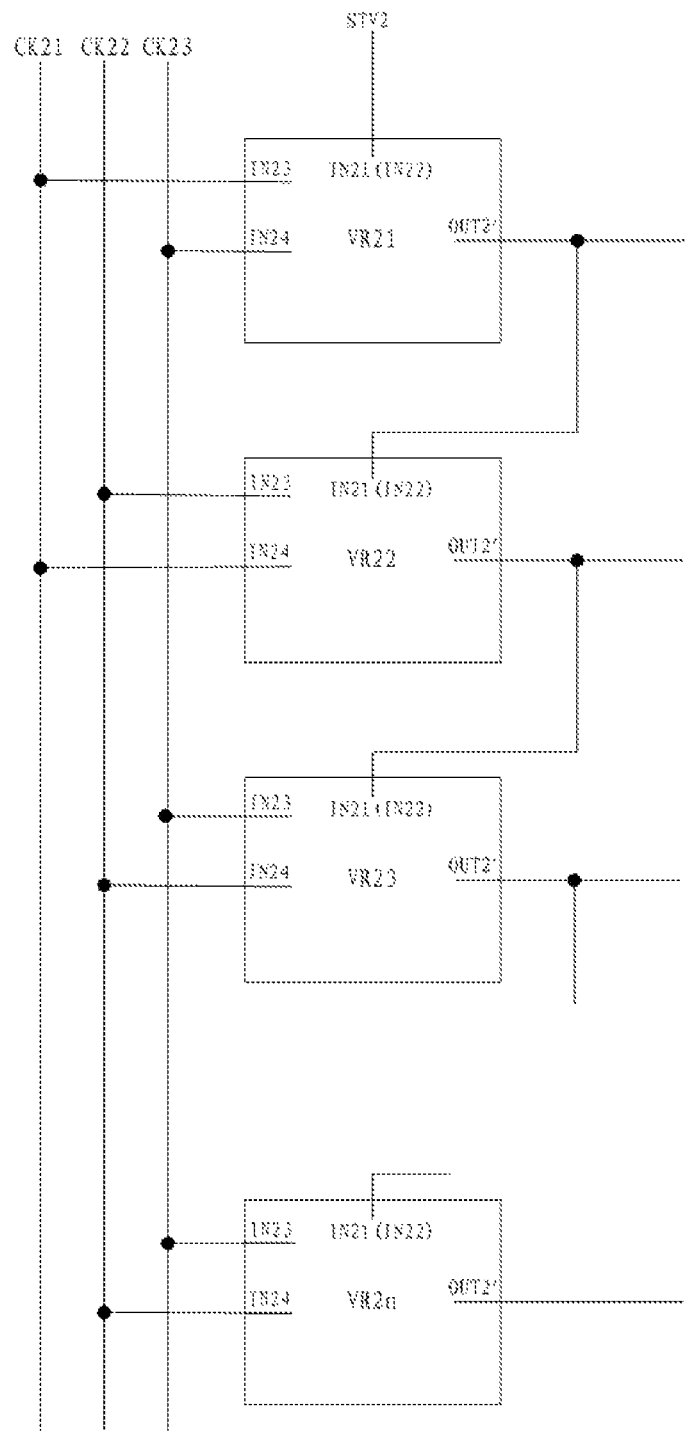
FIG. 25 illustrates another exemplary scanning driving circuit consistent with various disclosed embodiments in the present disclosure.

FIG. 25 illustrates a scanning driving circuit provided by one embodiment of the present disclosure. As illustrated in FIG. 25, the multi-level shift register circuits may be arranged in cascade. The multi-level shift register circuits may include a first-level shift register circuit VR21 to an Nth-level shift register circuit VR2n, where N is an integer larger than or equal to 3.

The gate driver circuit may further include a turn-on signal line STV2, a first clock signal line CK21, a second clock signal line CK22, and a third clock signal line CK23. Both a first input terminal IN21 and a second input terminal IN22 of the first-level shift register circuit VR21 may be electrically connected to the turn-on signal line STV2. Except for the first-level shift register circuit VR21, a first input terminal IN21 and a second input terminal IN22 of each level shift register circuit may be electrically connected to the output terminal OUT2' of the output module of the previous level shift register circuit. For the i-th level shift register circuit, the third input terminal IN23 may be electrically connected to the first clock signal line CK21, and the fourth input terminal IN24 may be electrically connected to the third clock signal line CK23. For the i+1-th level shift register circuit, the third input terminal IN23 may be electrically connected to the second clock signal line CK22, and the fourth input terminal IN24 may be electrically connected to the first clock signal line CK21. For the i+2 level shift register circuit, the third input terminal IN23 may be electrically connected to the third clock signal line CK23, and the fourth input terminal IN24 may be electrically connected to the second clock signal line CK22, where i=3n+1 with n being an integer greater than or equal to 0, and i+2 being a positive integer less than N. The enable signal segments of the first clock signal line CK11, the second clock signal line CK12, and the third clock signal line CK13 may be sequentially arranged in time.

Figure 26:
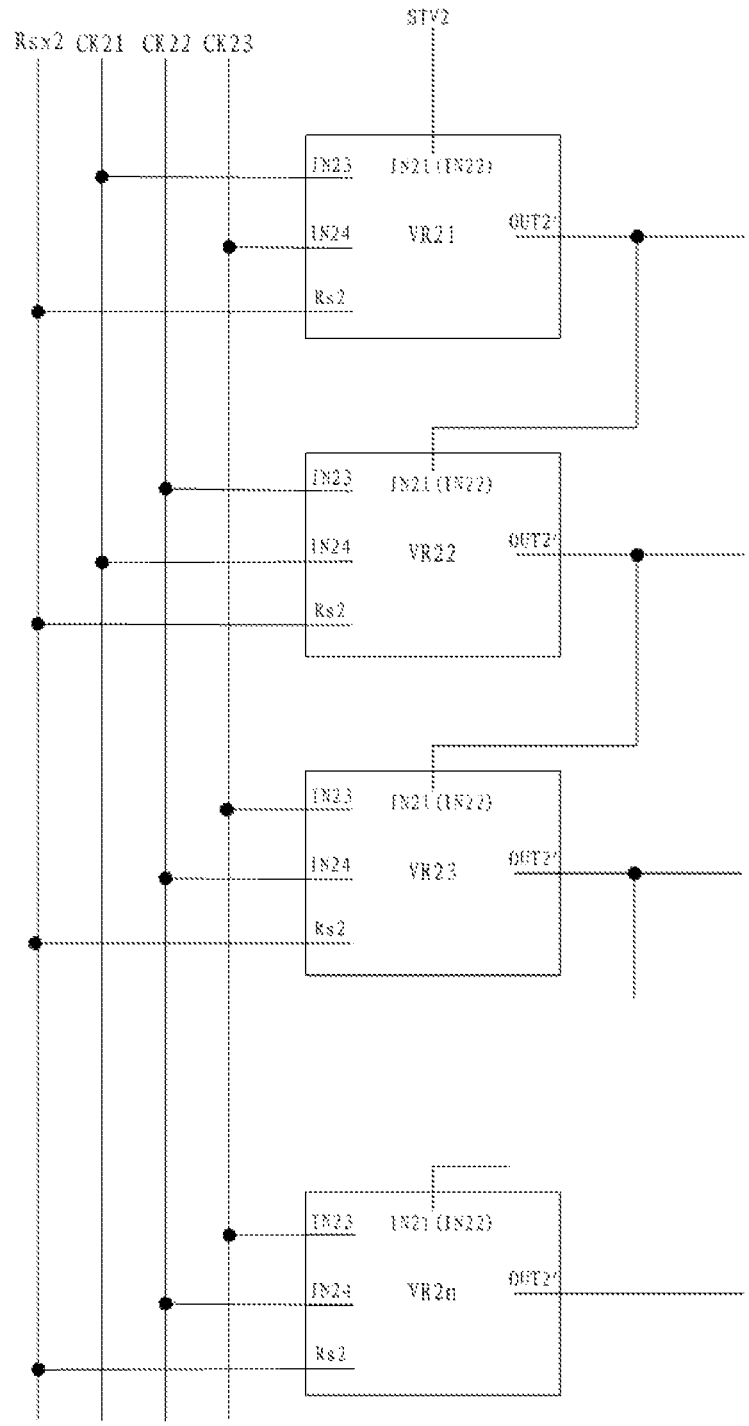
FIG. 26 illustrates another exemplary scanning driving circuit consistent with various disclosed embodiments in the present disclosure.
Figure 27:
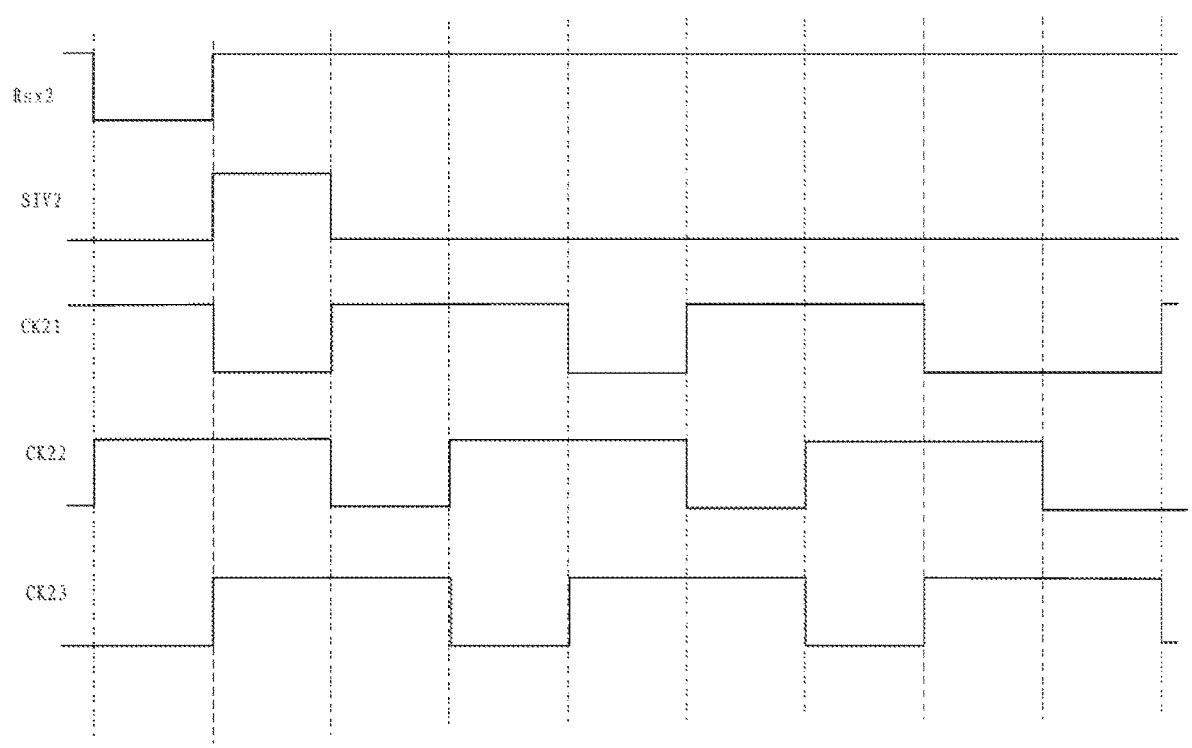
FIG. 27 illustrates another exemplary timing diagram of a scanning driving circuit consistent with various disclosed embodiments in the present disclosure.

Another embodiment shown in FIG. 26 provides another scanning driving circuit. As illustrated in FIG. 26, the shift register circuit may further include a reset module, and the scanning driving circuit may further include a reset control signal line Rsx2. The reset control signal terminals Rs2 of the multiple level shift register circuits may all be electrically connected to the reset control signal line Rsx2. As illustrated in FIG. 27 showing a timing diagram of the scanning driving circuit provided by the present embodiment. For example, the turn-on signal line STV2, the first clock signal line CK21, the second clock signal line CK22, and the third clock signal line CK23, and the reset control signal line Rsx2 may output the enable signals with low level. The reset control signal line Rsx2 may output the low level enable signal before the turn-on signal line STV2 outputs the non-enable signal. The enable signal segments of the first clock signal line CK11, the second clock signal line CK12, and the third clock signal line CK13 may be sequentially arranged in time. That is, the second clock signal line CK12 outputs the enable signal after the first clock signal line CK11 outputs the enable signal, the third clock signal line CK13 outputs the enable signal after the second clock signal line CK12 outputs the enable signal. After the clock signal line CK12 outputs the enable signal, and the first clock signal line CK11 outputs the enable signal after the third clock signal line CK13 outputs the enable signal, and so on.

In one embodiment, the scanning driving circuit may be used to drive a pixel circuit in a display region of a display device to operate. The pixel circuit may be electrically connected to a light-emitting device. The pixel circuit may include a driving transistor, a plurality of transistors and a plurality of capacitors. All transistors and the plurality of capacitors may cooperate to provide driving current to the light-emitting device, such that the light-emitting device may emit light in response to the driving current. In one embodiment, the scanning driving circuit may be used to provide a light-emitting control signal EMIT to the pixel circuit. The structure and driving process of the pixel circuit can refer to the embodiments shown in FIG. 12 and FIG. 13.

Figure 28:
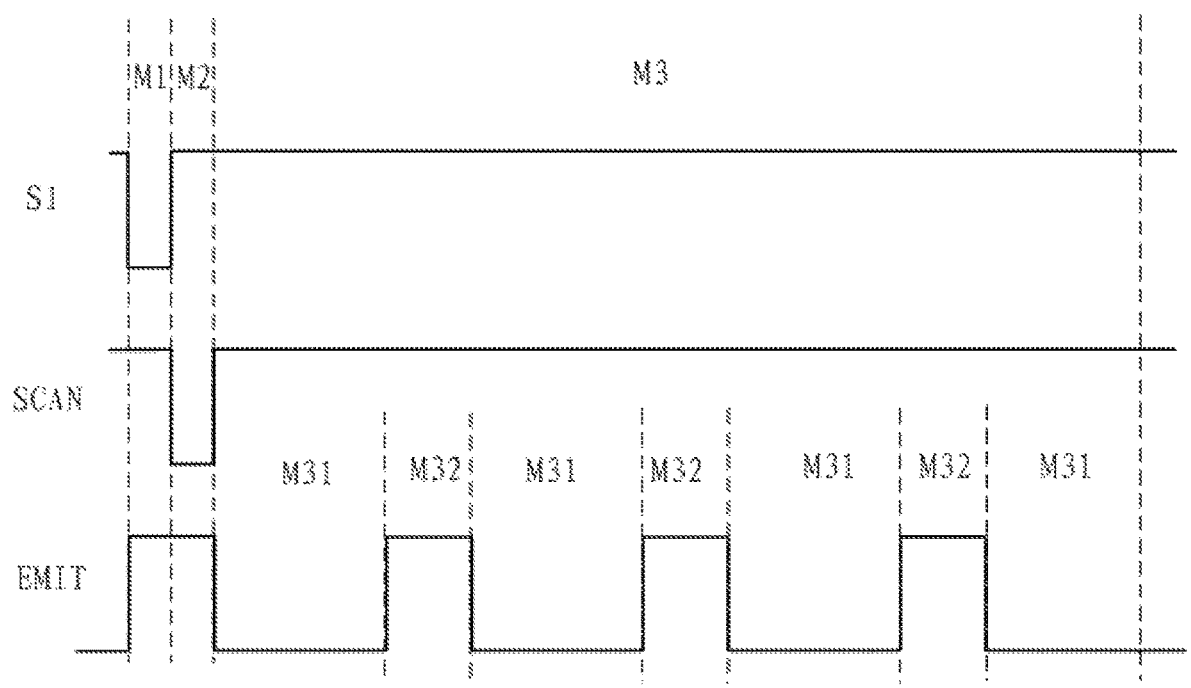
FIG. 28 illustrates another exemplary timing diagram of a pixel circuit consistent with various disclosed embodiments in the present disclosure.

FIG. 28 illustrates a timing diagram of a pixel circuit provided by one embodiment of the present disclosure. For description purposes only, the embodiment with the pixel circuit in FIG. 12 and the light-emitting control signal EMIT same as the signal of the output terminal 2 in FIG. 24 will be used as an example to illustrate the present disclosure, and does not limit the scope of the present disclosure. In one embodiment, the operating process of the pixel circuit may include a reset stage M1, a data writing stage M2, and a light-emitting stage M3 performed sequentially.

In the reset stage M1, the reset transistor T1 may be turned on to transmit the reference voltage Vref to the gate of the driving transistor T0, and the transistors of the data writing module 20 and light-emitting control module 30 may all be turned off. The reference voltage Vref may be a voltage able to turn on the driving transistor T0.

In the data writing stage M2, the transistor of the light-emitting control module 30 and the reset transistor may both be turned off, while the first data writing transistor T2 and the second data writing transistor T3 may be turned on. The first data writing transistor T2 may transmit the data voltage Vdata to the first terminal of the driving transistor T0, and the second data writing transistor T3 may connect the gate of the driving transistor T0 to the second terminal of the second data writing transistor T3.

The light-emitting stage M3 may include a normal light-emitting stage M31 and a light adjusting stage M32. In the normal light-emitting stage M31, the transistors of the data writing module 20 and the reset transistor T1 may all be turned off, while the first light-emitting control transistor T4 and the second light-emitting control transistor T5 may be turned on in response to the enable signal of the light emitting control signal EMIT, to form a conducting path of the first voltage PVDD, the first light-emitting control transistor T4, the driving transistor T0, the second light-emitting control transistor T5, the light emitting device 50, and the second voltage PVEE. The driving current generated by the driving transistor T0 may be transmitted to the light-emitting device 50, and the light-emitting device 50 may emit light in response to the driving current.

In the light adjusting stage M32, the transistors of the data writing module 20 and the reset transistor T1 may all be turned off, while the first light-emitting control transistor T4 and the second light-emitting control transistor T5 may be turned off in response to the non-enable signal of the light emitting control signal EMIT, to achieve light adjusting. Further, the turn-off duration of the light-emitting device 50 may be controlled by controlling the duration of the non-enable signal of the light-emitting control signal.

In the present disclosure, the number of times that the light-emitting device is extinguished in a frame may be controlled by controlling the number of times that the non-enable signal segment of the turn-on signal appears in a frame of the picture. The purpose of dim dimming may be realized, where dim dimming is to control the light-emitting device to turn off the light-emitting device for a preset number of times in a frame of picture, to control the modulation of the light-emitting brightness of the light-emitting device and reduce the flicker of the picture. Further, by controlling the duration of the non-enable signal segment of the turn-on signal, the duration of the second power terminal outputting the light-emitting control signal may be adjusted, to control the duration of the light-emitting device being turned off, and realize the modulation of the light-emitting device's turn-off duration.

For description purposes only, the above embodiment is used as an example to illustrate the present disclosure, and does not limit the scopes of the present disclosure. In various embodiments, the pixel circuit may have any suitable circuit structure. In various embodiments, the driving transistors, reset transistors, data writing transistors, and light-emitting control transistors may all be P-type thin film transistors, or the driving transistors, reset transistors, data writing transistors, and light-emitting control transistors may all be N-type thin film transistors. The first voltage provided by the embodiments of the present disclosure may be the voltage provided by the anode electrical-level terminal, and the second voltage may be the voltage provided by the cathode electrical-level terminal. The light-emitting device may be a light-emitting diode including an inorganic light-emitting diode or an organic light-emitting diode. The present disclosure has no limit on this.

Figure 29:
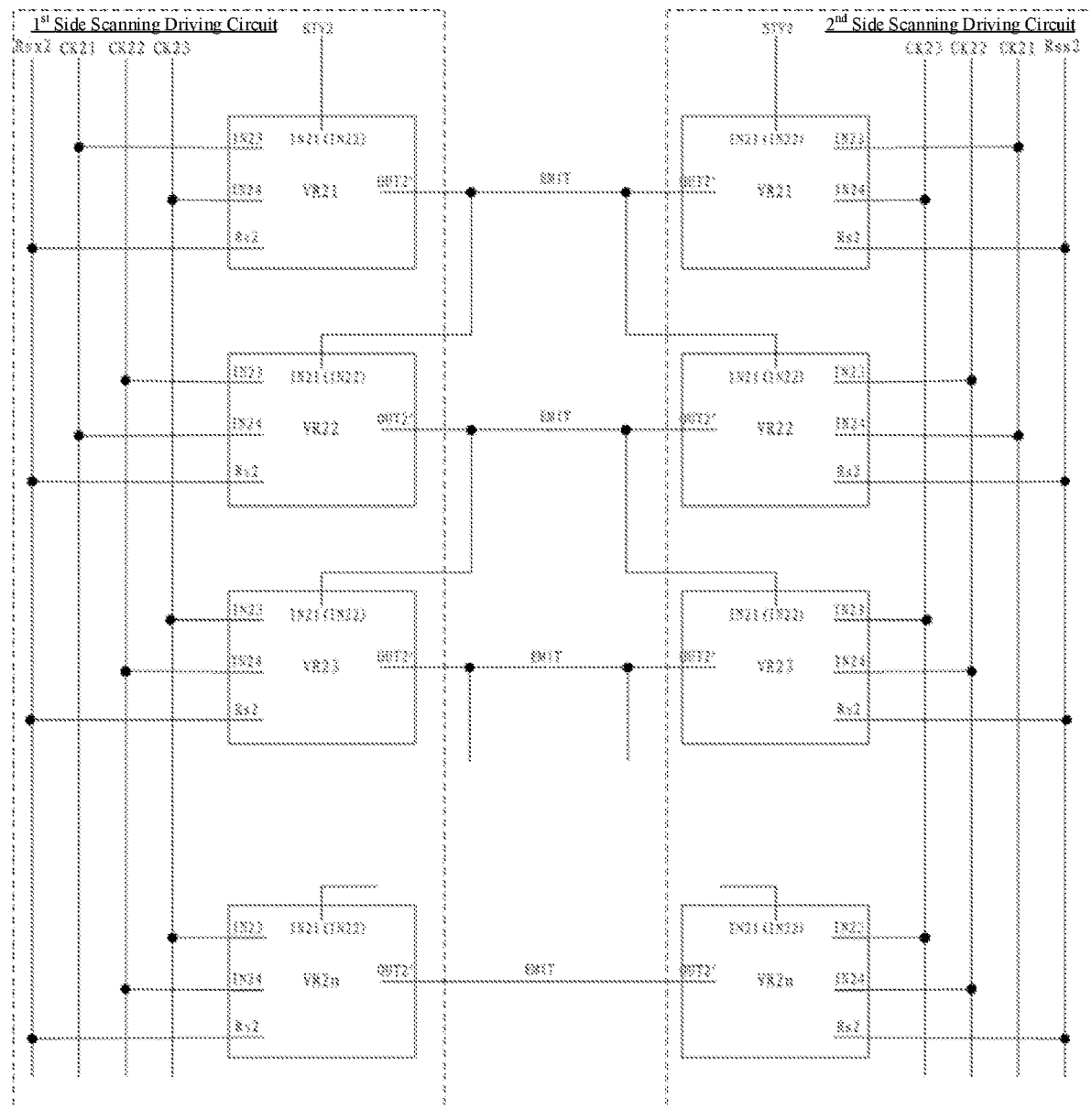
FIG. 29 illustrates another exemplary display panel consistent with various disclosed embodiments in the present disclosure.

The present disclosure also provides a display device. The display device may include any display panel provided by various embodiments of the present disclosure. In one embodiment, the display device may only include a single-side scanning driving circuit. That is, a scanning driving circuit provided by various embodiments of the present disclosure may be disposed at a side of the display region of the display panel, and scanning of all scanning units of the display device may be achieved through the single-side scanning driving circuit. In another embodiment, the display device may include a double-sided scan driving circuit. Specifically, as shown in FIG. 29 showing a schematic structural diagram of the display panel, the display device may include a first side scanning driving circuit and a second side scanning driving circuit opposite to each other. In the first side scanning driving circuit and the second side scanning driving circuit, the output terminals OUT2' of the shift register circuits of a same level may be connected to the same light-emitting control signal line EMIT, thereby improving delay in the transmission of the light-emitting control signal on the light-emitting control signal line EMIT.

Figure 30:
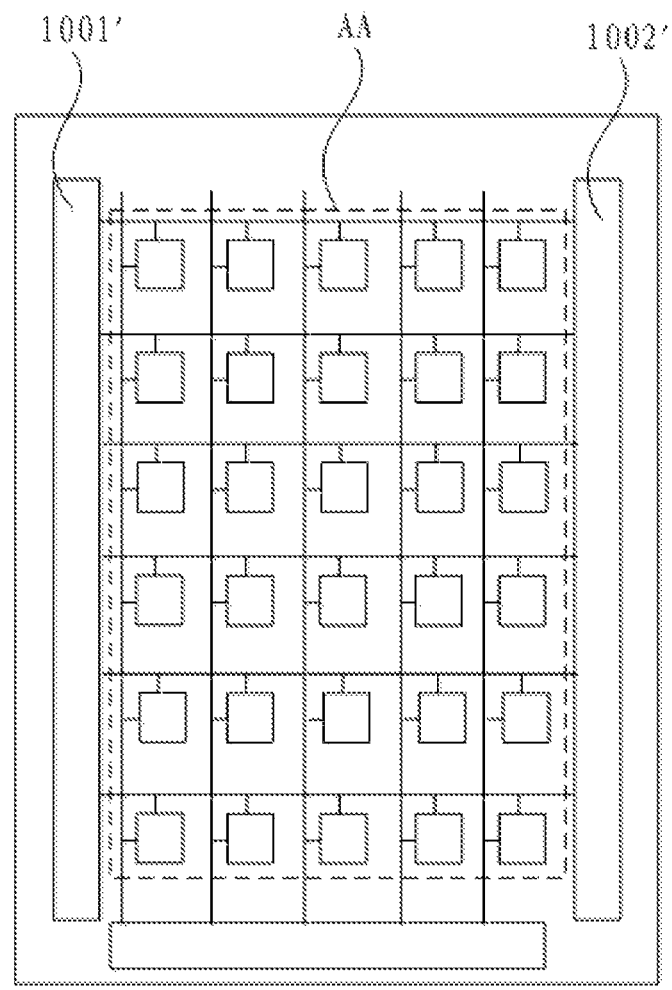
FIG. 30 illustrates another exemplary display panel consistent with various disclosed embodiments in the present disclosure.

Another embodiment of the present disclosure shown in FIG. 30 provides another display panel. As shown in FIG. 30, the display panel may includes the double-side scanning driving circuit. The first side scanning driving circuit 1001' and the second side scanning driving circuit 1002' may be disposed at two sides of the display region AA of the display panel respectively.

In various embodiments, the display device provided by the present disclosure may include a mobile terminal, a laptop computer, a tablet computer, a computer, or a wearable device. The present disclosure has no limit on this.

In the present disclosure, the shift register circuit may realize the latching of the voltage at the first node and the second node through the first inverter and the second inverter, ensuring that the voltage stability at the first node and the second node under low frequency and high frequency conditions is high. Correspondingly, the shift register circuit may have a high operating stability and the display effect of the display device may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A shift register circuit, comprising an input module, a first inverter, a second inverter, and an output module, wherein:
   the input module is electrically connected to a first input terminal, a second input terminal, a third input terminal, and a first electrical-level terminal, and is configured to respond to signals from the second input terminal and the third input terminal to control a potential of a first node;
   an input terminal of the first inverter is electrically connected to the first node, and an output terminal of the first inverter is electrically connected to a second node;
   an input terminal of the second inverter is electrically connected to the second node, and an output terminal of the second inverter is electrically connected to the first node; and
   the output module is configured to respond to a potential of the first node to provide a signal of a fourth input terminal to an output terminal of the output module, and is also configured to respond to a potential of the second node to provide a voltage of a first power terminal to the output terminal of the output module, wherein:
   the input module includes a first transistor,
   a first terminal of the first transistor is electrically connected to the first input terminal,
   a gate of the first transistor is electrically connected to the second input terminal,
   a second terminal of the first transistor is electrically connected to the first node, and
   a width-length ratio of the first transistor is larger than a width-length ratio of one transistor of transistors in the second inverter connected to an electrical-level signal opposite to an enable signal outputted by the first input terminal.

2. The shift register circuit according to claim 1, wherein:
   at least one inverter of the first inverter and the second inverter includes a P-type transistor and an N-type transistor;
   a gate of the P-type transistor and a gate of the N-type transistor are electrically connected as the input terminal of the at least one inverter;
   a second terminal of the P-type transistor and a second terminal of the N-type transistor are electrically connected as the output terminal of the at least one inverter; and
   a first terminal of the P-type transistor is connected to a high level signal and a first terminal of the N-type transistor is connected to a low level signal.

3. The shift register circuit according to claim 2, wherein: the N-type transistor is a metal oxide transistor.

4. The shift register circuit according to claim 1, wherein: signals of the first input terminal and the second input terminal both are turn-on signals;
   a signal of the third input terminal is a first clock signal; and
   a signal of the fourth input terminal is a second clock signal.

5. The shift register circuit according to claim 4, wherein:
   in one clock period of the first clock signal, a ratio between a duration of an enable signal segment and a duration of a non-enable signal segment is about 1/2; and
   in one clock period of the second clock signal, a ratio between a duration of an enable signal segment and a duration of a non-enable signal segment is about 1/2.

6. The shift register circuit according to claim 1, wherein:
   the input module further includes a second transistor;
   a first terminal of the second transistor is electrically connected to the first electrical-level terminal;
   a second terminal of the second transistor is electrically connected to the first node; and
   a gate of the second transistor is electrically connected to the third input terminal.

7. The shift register circuit according to claim 6, wherein a driving capability of the first transistor is larger than a driving capability of one transistor of transistors in the second inverter connected to an electrical-level signal opposite to an enable signal outputted by the first input terminal.

8. The shift register circuit according to claim 6, wherein a driving capability of the second transistor is larger than a driving capability of one transistor of transistors in the second inverter connected to an electrical-level signal opposite to an electrical-level signal output by the first electrical-level terminal.

9. The shift register circuit according to claim 6, wherein a width-length ratio of the second transistor is larger than a width-length ratio of one transistor of transistors in the second inverter connected to an electrical-level signal opposite to an electrical-level signal output by the first electrical-level terminal.

10. The shift register circuit according to claim 1, wherein:
the output module includes a third transistor and a fourth transistor;
a first terminal of the third transistor is electrically connected to the fourth input terminal;
a second terminal of the third transistor is electrically connected to the output terminal of the output module;
a gate of the third transistor is electrically connected to the first node;
a first terminal of the fourth transistor is electrically connected to the first power terminal;
a second terminal of the fourth transistor is electrically connected to the output terminal of the output module; and
a gate of the fourth transistor is electrically connected to the second node.

11. The shift register circuit according to claim 1, further including a conduction transistor electrically connected between the first node and the output module, wherein:
a first terminal of the conduction transistor is electrically connected to the first node;
a second terminal of the conduction transistor is electrically connected to the output module;
a gate of the conduction transistor is electrically connected to an on-hold signal terminal; and
the conduction transistor is configured to control the conduction transistor to maintain an on state in response to the signal from the on-hold signal terminal.

12. The shift register circuit according to claim 1, further including a reset module, wherein:
the reset module is electrically connected to the first node, a reset control signal terminal, and the first electrical-level terminal, and the reset module is configured to respond to a signal of the reset control signal terminal to provide a voltage of the first electrical-level terminal to the first node.

13. The shift register circuit according to claim 12, wherein:
the reset module includes a fifth transistor;
a first terminal of the fifth transistor is electrically connected to the first electrical-level terminal;
a second terminal of the fifth transistor is electrically connected to the first node;
a gate of the fifth transistor is electrically connected to the reset control signal terminal; and
a driving capability of the fifth transistor is larger than a driving capability of one transistor of transistors in the second inverter with an electrical-level signal opposite to an electrical-level signal outputted by the first electrical-level terminal.

14. A driving method for a shift register circuit, comprising a first stage, a second stage, and a third stage performed sequentially, wherein:
the shift register circuit includes an input module, a first inverter, a second inverter, and an output module;
the input module is electrically connected to a first input terminal, a second input terminal, a third input terminal, and a first electrical-level terminal, and is configured to respond to signals from the second input terminal and the third input terminal to control a potential of a first node;
an input terminal of the first inverter is electrically connected to the first node, and an output terminal of the first inverter is electrically connected to a second node;
an input terminal of the second inverter is electrically connected to the second node, and an output terminal of the second inverter is electrically connected to the first node; and
the output module is configured to respond to a potential of the first node to provide a signal of a fourth input terminal to an output terminal of the output module, and is also configured to respond to a potential of the second node to provide a voltage of a first power terminal to the output terminal of the output module, wherein:
the input module includes a first transistor,
a first terminal of the first transistor is electrically connected to the first input terminal,
a gate of the first transistor is electrically connected to the second input terminal,
a second terminal of the first transistor is electrically connected to the first node, and
a width-length ratio of the first transistor is larger than a width-length ratio of one transistor of transistors in the second inverter connected to an electrical-level signal opposite to an enable signal outputted by the first input terminal;
in the first stage, the input module controlling the first input terminal to be connected to the first node in response to the signal of the second input terminal, and the output module controlling the fourth input terminal to be connected to the output terminal of the output module in response to the signal of the first node;
in the second stage, the output module maintaining a control of the fourth input terminal to be connected to the output terminal of the output module in response to the signal of the first node; and
in the third stage, the input module controlling the first electrical-level terminal to be connected to the first node in response to the signal of the third input terminal, and the output module controlling the first power terminal to be connected to the output terminal of the output module in response to the signal of the second node.

15. The driving method according to claim 14, wherein:
in the first stage, the first input terminal is low level, the second input terminal is low level, the third input terminal is high level, and the fourth input terminal is high level;
in the second stage, the first input terminal is high level, the second input terminal is high level, the third input terminal is high level, and the fourth input terminal is low level; and
in the third stage, the first input terminal is high level, the second input terminal is high level, the third input terminal is low level, and the fourth input terminal is high level.

16. The driving method according to claim 14, wherein:
the shift register circuit further includes a reset module;
the driving method further includes a reset stage before the first stage; and
in the reset stage, the reset module controls the first electrical-level terminal to be connected to the first node in response to a signal of a reset control signal terminal.

17. A display panel comprising a scanning driving circuit, wherein:
the scanning driving circuit includes multi-level shift register circuits;
each shift register circuit of the multi-level shift register circuits includes an input module, a first inverter, a second inverter, and an output module;
the input module is electrically connected to a first input terminal, a second input terminal, a third input terminal, and a first electrical-level terminal, and is configured to respond to signals from the second input terminal and the third input terminal to control a potential of a first node;
an input terminal of the first inverter is electrically connected to the first node, and an output terminal of the first inverter is electrically connected to a second node;
an input terminal of the second inverter is electrically connected to the second node, and an output terminal of the second inverter is electrically connected to the first node; and
the output module is configured to respond to a potential of the first node to provide a signal of a fourth input terminal to an output terminal of the output module, and is also configured to respond to a potential of the second node to provide a voltage of a first power terminal to the output terminal of the output module, wherein:
the input module includes a first transistor,
a first terminal of the first transistor is electrically connected to the first input terminal,
a gate of the first transistor is electrically connected to the second input terminal,
a second terminal of the first transistor is electrically connected to the first node, and
a width-length ratio of the first transistor is larger than a width-length ratio of one transistor of transistors in the second inverter connected to an electrical-level signal opposite to an enable signal outputted by the first input terminal;
the multi-level shift register circuits are arranged in cascade, and includes a first level shift register circuit to an N-th level shift register circuit, wherein N is an integer larger than or equal to 3;
the scanning driving circuit further includes a turn-on signal line, a first clock signal line, a second clock signal line, and a third clock signal line;
a first input terminal and a second input terminal of the first-level shift register circuit are both electrically connected to the turn-on signal line;
except for the first-level shift register circuit, a first input terminal and a second input terminal of each level shift register circuit are both electrically connected to the output terminal of the output module of a previous level shift register circuit;
for an i-th level shift register circuit, a third input terminal thereof is electrically connected to the second clock signal line, and a fourth input terminal is electrically connected to the first clock signal line;
for an (i+1)-th level shift register circuit, a third input terminal thereof is electrically connected to the third clock signal line and a fourth input terminal is electrically connected to the second clock signal line;
for an (i+2) level shift register circuit, a third input terminal thereof is electrically connected to the first clock signal line and a fourth input terminal thereof is electrically connected to the third clock signal line;

i=3n+1, wherein n is an integer larger than or equal to 0, and i+2 is a positive integer less than N; and
the enable signal segments of the first clock signal line, the second clock signal line, and the third clock signal line are sequentially arranged in time.

18. The display panel according to claim 17, further including a reset control signal line, wherein:
a reset control signal terminal of each level shift register circuit is electrically connected to the reset control signal line.

19. A display device, comprising a display panel, wherein:
the display panel including a scanning driving circuit;
the scanning driving circuit includes multi-level shift register circuits;
each shift register circuit of the multi-level shift register circuits includes an input module, a first inverter, a second inverter, and an output module;
the input module is electrically connected to a first input terminal, a second input terminal, a third input terminal, and a first electrical-level terminal, and is configured to respond to signals from the second input terminal and the third input terminal to control a potential of a first node;
an input terminal of the first inverter is electrically connected to the first node, and an output terminal of the first inverter is electrically connected to a second node;
an input terminal of the second inverter is electrically connected to the second node, and an output terminal of the second inverter is electrically connected to the first node; and
the output module is configured to respond to a potential of the first node to provide a signal of a fourth input terminal to an output terminal of the output module, and is also configured to respond to a potential of the second node to provide a voltage of a first power terminal to the output terminal of the output module, wherein:
the input module includes a first transistor,
a first terminal of the first transistor is electrically connected to the first input terminal,
a gate of the first transistor is electrically connected to the second input terminal,
a second terminal of the first transistor is electrically connected to the first node, and
a width-length ratio of the first transistor is larger than a width-length ratio of one transistor of transistors in the second inverter connected to an electrical-level signal opposite to an enable signal outputted by the first input terminal;
the multi-level shift register circuits are arranged in cascade, and includes a first level shift register circuit to an N-th level shift register circuit, wherein N is an integer larger than or equal to 3;
the scanning driving circuit further includes a turn-on signal line, a first clock signal line, a second clock signal line, and a third clock signal line;
a first input terminal and a second input terminal of the first-level shift register circuit are both electrically connected to the turn-on signal line;
except for the first-level shift register circuit, a first input terminal and a second input terminal of each level shift register circuit are both electrically connected to the output terminal of the output module of a previous level shift register circuit;
for an i-th level shift register circuit, a third input terminal thereof is electrically connected to the second clock signal line, and a fourth input terminal is electrically connected to the first clock signal line;

for an (i+1)-th level shift register circuit, a third input terminal thereof is electrically connected to the third clock signal line and a fourth input terminal is electrically connected to the second clock signal line;

for an (i+2) level shift register circuit, a third input terminal thereof is electrically connected to the first clock signal line and a fourth input terminal thereof is electrically connected to the third clock signal line;

i=3n+1, wherein n is an integer larger than or equal to 0, and i+2 is a positive integer less than N; and the enable signal segments of the first clock signal line, the second clock signal line, and the third clock signal line are sequentially arranged in time.

\* \* \* \* \*